(12) United States Patent
Nonaka et al.

(10) Patent No.: US 7,146,116 B2
(45) Date of Patent: Dec. 5, 2006

(54) HEAT GENERATING APPARATUS USING ELECTROMAGNETIC INDUCTION

(75) Inventors: Yasuhiro Nonaka, Saga (JP); Tomoyuki Noguchi, Fukuoka (JP); Tadayuki Kajiwara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 159 days.

(21) Appl. No.: 10/765,974

(22) Filed: Jan. 29, 2004

(65) Prior Publication Data

US 2004/0240898 A1 Dec. 2, 2004

(30) Foreign Application Priority Data

| Jan. 31, 2003 | (JP) | ............. P.2003-023780 |
| Jan. 31, 2003 | (JP) | ............. P.2003-023781 |
| Feb. 21, 2003 | (JP) | ............. P.2003-044544 |
| Mar. 14, 2003 | (JP) | ............. P.2003-069989 |

(51) Int. Cl.
*G03G 15/20* (2006.01)

(52) U.S. Cl. .............. 399/33; 399/69; 219/216

(58) Field of Classification Search ............ 399/33, 399/150, 89, 330, 69; 219/619, 497, 216
See application file for complete search history.

(56) References Cited

U.S. PATENT DOCUMENTS

| 4,467,165 | A |   | 8/1984 | Kiuchi et al. |
| 4,764,652 | A | * | 8/1988 | Lee ............... 219/627 |
| 5,794,096 | A | * | 8/1998 | Okabayashi ........... 399/33 |
| 5,801,359 | A |   | 9/1998 | Mano et al. |
| 6,130,826 | A |   | 10/2000 | Matsumoto |
| 6,697,580 | B1 | * | 2/2004 | Nakayama ............ 399/33 |
| 6,775,491 | B1 | * | 8/2004 | Akutsu et al. ............ 399/69 |
| 2002/0005405 | A1 | * | 1/2002 | Sato et al. ............. 219/667 |
| 2002/0130945 | A1 |   | 9/2002 | Samei et al. |

FOREIGN PATENT DOCUMENTS

| JP | 8-22206 | 1/1996 |
| JP | 2000-184698 | 6/2000 |
| JP | 2001-318546 | 11/2001 |
| JP | 2002-82549 | 3/2002 |
| JP | 2002-174982 | 6/2002 |
| JP | 2002-208469 | 7/2002 |
| JP | 2002-214962 | 7/2002 |
| JP | 2002-236429 | 8/2002 |
| JP | 2003-17221 | 1/2003 |

OTHER PUBLICATIONS

English Language Abstract of JP 2001-318546.
English Language Abstract of JP 2002-82549.
English language Abstract of JP 2002-236429.
English language Abstract of JP 2003-17221.
English language Abstract of JP 2002-214962.
English language Abstract of JP 2002-174982.
English language Abstract of JP 2002-208469.

* cited by examiner

*Primary Examiner*—David M. Gray
*Assistant Examiner*—Ryan D. Walsh
(74) *Attorney, Agent, or Firm*—Greenblum & Bernstein, P.L.C.

(57) ABSTRACT

When a temperature control does not operate, and a thermal runaway state occurs, the temperatures of a heating roller and a thermostat rise rapidly. When the rise in the temperature occurs such that the temperature of the thermostat reaches or exceeds a predetermined temperature, both ends of a thermostat are brought into an open circuit state. Thus the supply of a power from a commercial power source to an exciting coil is directly cut off.

9 Claims, 22 Drawing Sheets

100V SYSTEM

200V SYSTEM

HEAT GENERATING APPARATUS USING ELECTROMAGNETIC INDUCTION

BACKGROUND OF THE INVENTION

The present invention relates to an electrostatic recording type image forming apparatus such as a copying machine, a facsimile or a printer, and more particularly to a heat generating apparatus and a fixing apparatus using electromagnetic induction.

For an image forming apparatus such as a printer, a copying machine or a facsimile, in recent years, market demands for energy saving and an increase in a speed have been made more greatly. In order to achieve the performance of these demands, it is important that the thermal efficiencies of a heat generating apparatus and a fixing apparatus which are used in the image forming apparatus are to be improved.

In the image forming apparatus, an unfixed toner image is formed on a recording medium such as a sheet material, a printing paper, a sensitive paper or an electrostatic recording paper by an image transfer method or a direct method through an image forming process such as electrophotographic recording, electrostatic recording or magnetic recording. As a fixing apparatus for fixing the unfixed toner image, a fixing apparatus using a contact heating method such as a heat roller method, a film heating method or an electromagnetic induction heating method has widely been employed.

For the fixing apparatus using an electromagnetic induction heating method, JP-A-8-22206 has proposed a technique for generating Joule heat by an eddy current generated on a heat generating member to be a magnetic metal member by the magnetic field of induction heating means formed by an exciting coil and for causing the heat generating member to carry out electromagnetic induction heat generation.

Description will be given to the structure of the inverter power circuit of a fixing apparatus using an electromagnetic induction heating method according to the conventional art. FIG. 26 is an electric block diagram showing induction heating means and the inverter power circuit in the fixing apparatus using the electromagnetic induction heating method according to the conventional art.

In FIG. 26, a commercial power source 310 is connected to a rectifier diode 330 of a rectifying circuit for full wave rectification in an inverter power circuit 320, and is connected to either side of an exciting coil 220 in induction heating means 180 by connecting means 350 through a smoothing capacitor 340 of a smoothing circuit. Moreover, the commercial power source 310 is connected to a resonance capacitor 360 for resonance in parallel with the exciting coil 220 in the inverter power circuit 320.

Furthermore, either portion on the reverse side of the exciting coil 220 is connected to a switching unit (hereinafter referred to as an IGBT) 370 in the inverter power circuit 320 through the connecting means 350. Moreover, the IGBT 370 is connected to switching unit driving means 380 and is ON/OFF controlled in response to the control signal of a temperature control circuit 390. A DC power source 400 having a DC of 20V is connected to the switching unit driving means 380 through abnormal temperature detecting means (hereinafter referred to as a thermostat) in the induction heating means 180.

The IGBT 370 is turned ON/OFF so that a high frequency current flows to the exciting coil 220. A magnetic field is generated by the high-frequency current and an eddy current is generated in a heat generating member (hereinafter referred to as a heat roller) 130 to be a magnetic metal member provided opposite to the exciting coil 220, thereby generating Joule heat.

With such a circuit structure, the temperature of the heat roller 130 is controlled to be approximately 180° C. in a normal condition and both ends of a thermostat 210 are set in a short-circuit state.

When the temperature control does not act but a thermal runaway state is brought for some reason, the temperature of the heat roller 130 is rapidly raised so that the temperature of the thermostat 210 is also raised suddenly. When the rise in the temperature is continuously carried out so that the temperature of the thermostat 210 reaches 200° C. or more, both ends of the thermostat 210 are brought into an open-circuit state so that the supply of a power from the DC power source 400 to the switching unit driving means 380 is stopped. Since an output of the switching unit driving means 380 is pulled down, an input (hereinafter referred to as a gate) of the IGBT 370 is turned OFF when the supply of the power is stopped. Consequently, a current does not flow to the exciting coil 220 so that the heating over the heat roller 130 is stopped.

Even if the heat roller 130 reaches an abnormal temperature and this is detected by the thermostat 210 to stop the supply of a power from the DC power source 400 to the switching unit driving means 380, however, the line of the commercial power source 310 is not cut off but heating is further carried out due to the abnormality of the IGBT 370, resulting in fuming and ignition. Thus, there is a problem in respect of safety.

Moreover, it is necessary to change the induction heating means 180 and the inverter power circuit 320 depending on a supply voltage. In the case in which the induction heating means 180 is taken for the inverter power circuit 320 in manufacture, there is a problem in that the IGBT 370 in the inverter power circuit 320 breaks down.

SUMMARY OF THE INVENTION

Therefore, it is an object of the invention to provide a heat generating apparatus and a fixing apparatus which comprise abnormal temperature detecting means for cutting off a commercial power line when a heat generating member reaches an abnormal temperature and can stop the supply of a power to an exciting coil at the abnormal temperature by cutting off the commercial power line.

It is another object of the invention to provide a heat generating apparatus and a fixing apparatus which can decrease the number of the lead wires of connecting means for carrying out a connection to an exciting coil and abnormal temperature detecting means and can thus reduce a cost.

It is a further object of the invention to provide a heat generating apparatus and a fixing apparatus in which a power is not supplied to an exciting coil or an inverter power circuit even if the exciting coil is taken for the inverter power circuit depending on a supply voltage, and a switching unit can be prevented from breaking down.

In order to solve the problems, the invention provides a heat generating apparatus and a fixing apparatus comprising a heat generating member, induction heating means provided opposite to the heat generating member and serving to cause the heat generating member to generate heat by electromagnetic induction, abnormal temperature detecting means provided in a relative position of the induction heating means to the heat generating member and serving to stop supply of a power to an exciting coil when detecting an abnormal temperature of the heat generating member, an inverter power circuit for driving the induction heating means, and connecting means for connecting the exciting coil, the abnormal temperature detecting means and the inverter power circuit, wherein the abnormal temperature detecting means is electrically connected between a rectifying circuit and a smoothing circuit in the inverter power circuit.

DETAILED DESCRIPTION OF THE PREFERRED EMBODIMENTS

Figure 1:
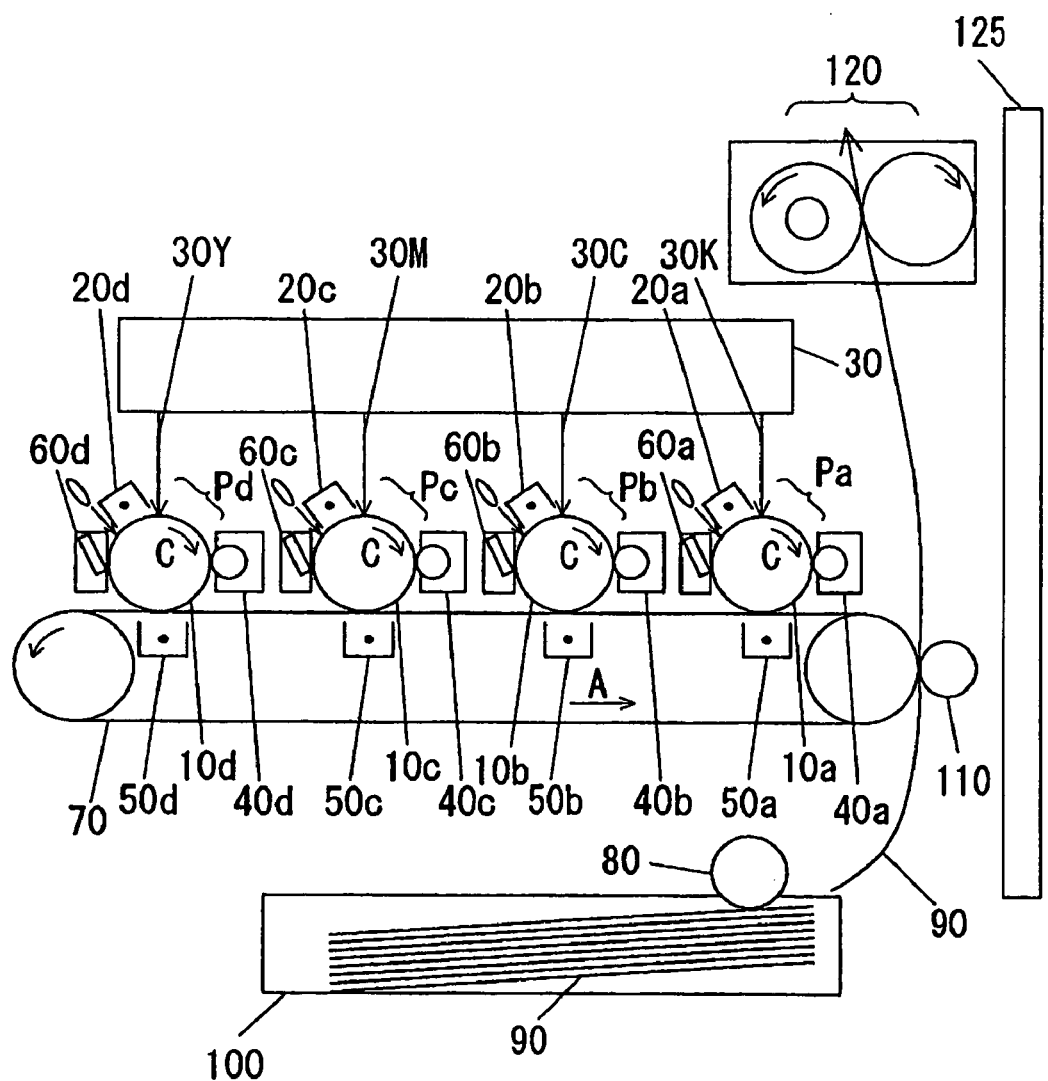
FIG. 1 is a view showing the structure of an image forming apparatus comprising a fixing apparatus according to an embodiment of the invention.

An embodiment of the invention will be described below with reference to FIGS. 1 to 9. In these drawings, the same members have the same reference numerals and repetitive explanation will be omitted.

Figure 2:
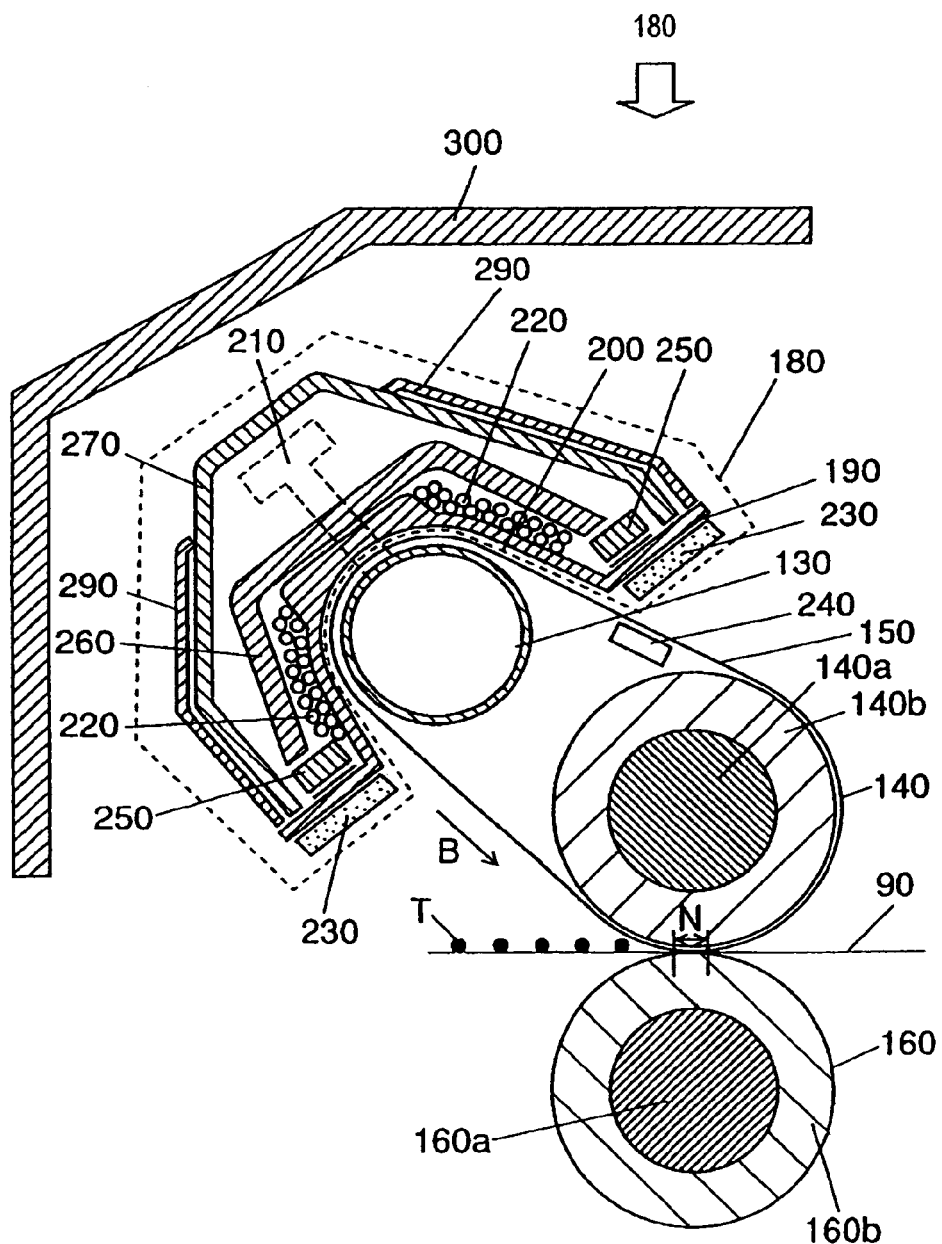
FIG. 2 is an explanatory view showing the structure of the fixing apparatus according to the embodiment of the invention which is to be used in the image forming apparatus of FIG. 1.
Figure 3:
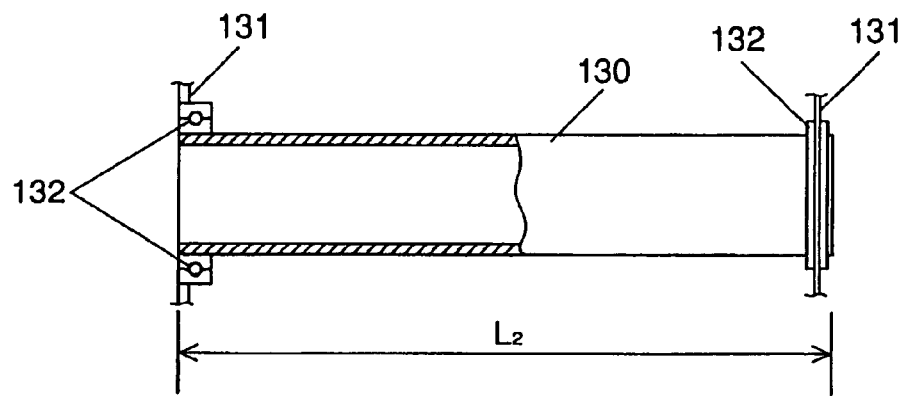
FIG. 3 is an explanatory view showing the structure of a heat roller constituting the fixing apparatus in FIG. 2, which is taken away.
Figure 4:
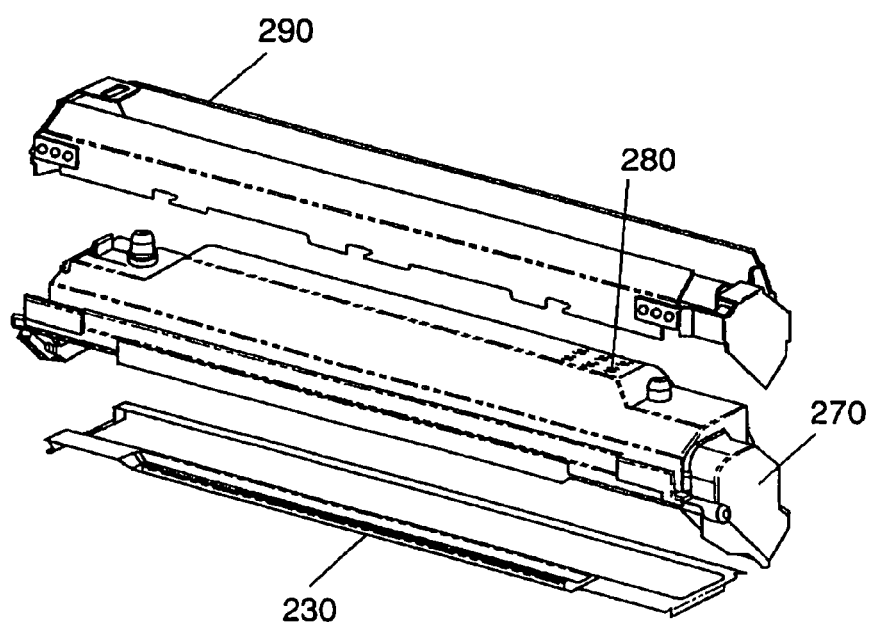
FIG. 4 is a view showing the structures of an exciting coil and a short ring which constitute the fixing apparatus in FIG. 2.
Figure 5:
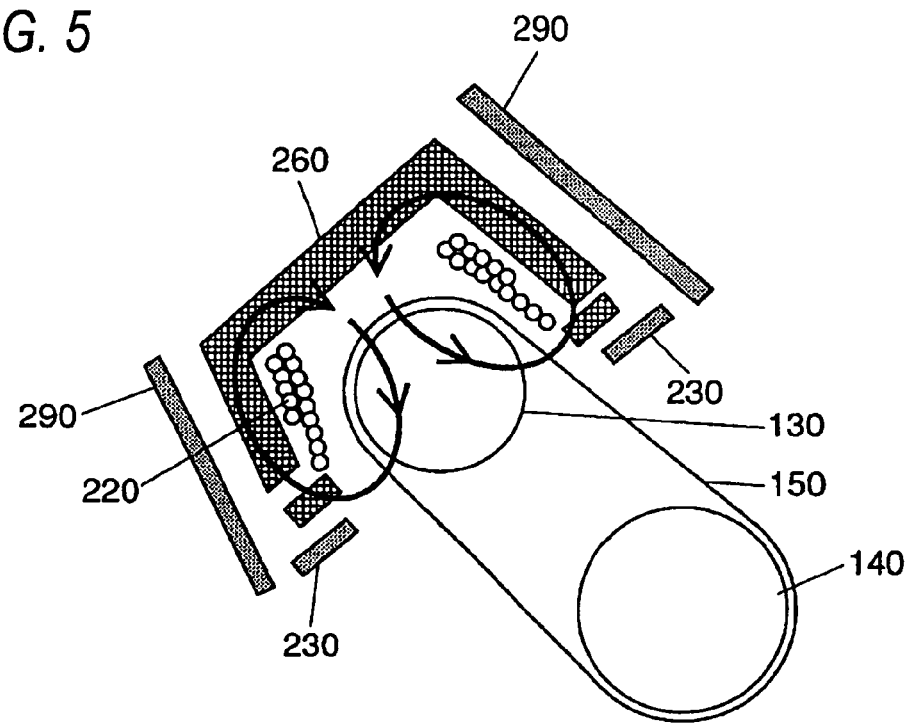
FIG. 5 is an explanatory view showing the state of the magnetic flux of induction heating means according to the embodiment of the invention.
Figure 6:
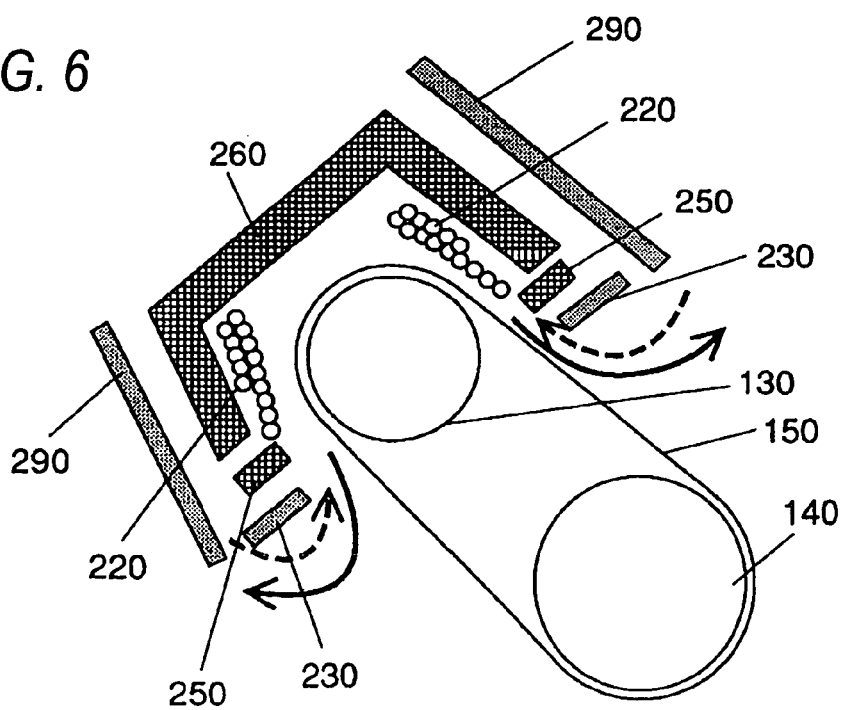
FIG. 6 is an explanatory view showing a state in which the magnetic flux is cancelled by the short ring of the induction heating means according to the embodiment of the invention.
Figure 7:
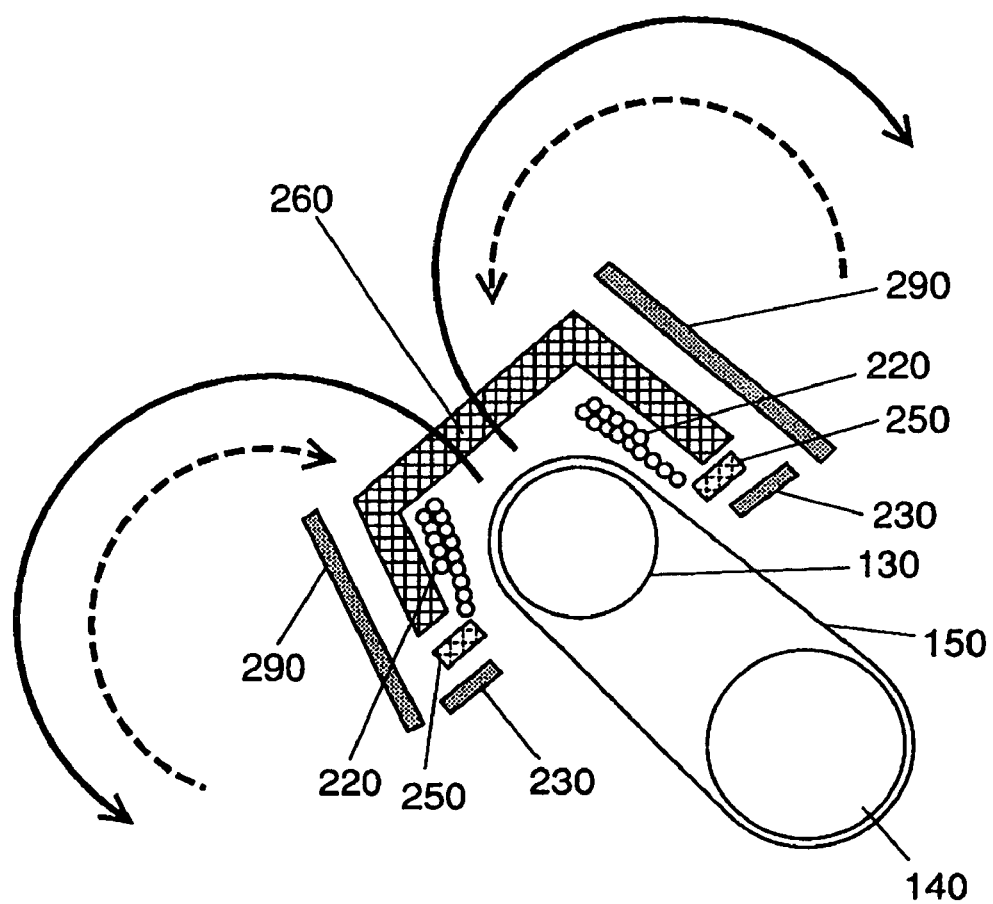
FIG. 7 is an explanatory view showing a state in which the magnetic flux is cancelled by the short ring of the induction heating means according to the embodiment of the invention.
Figure 8:
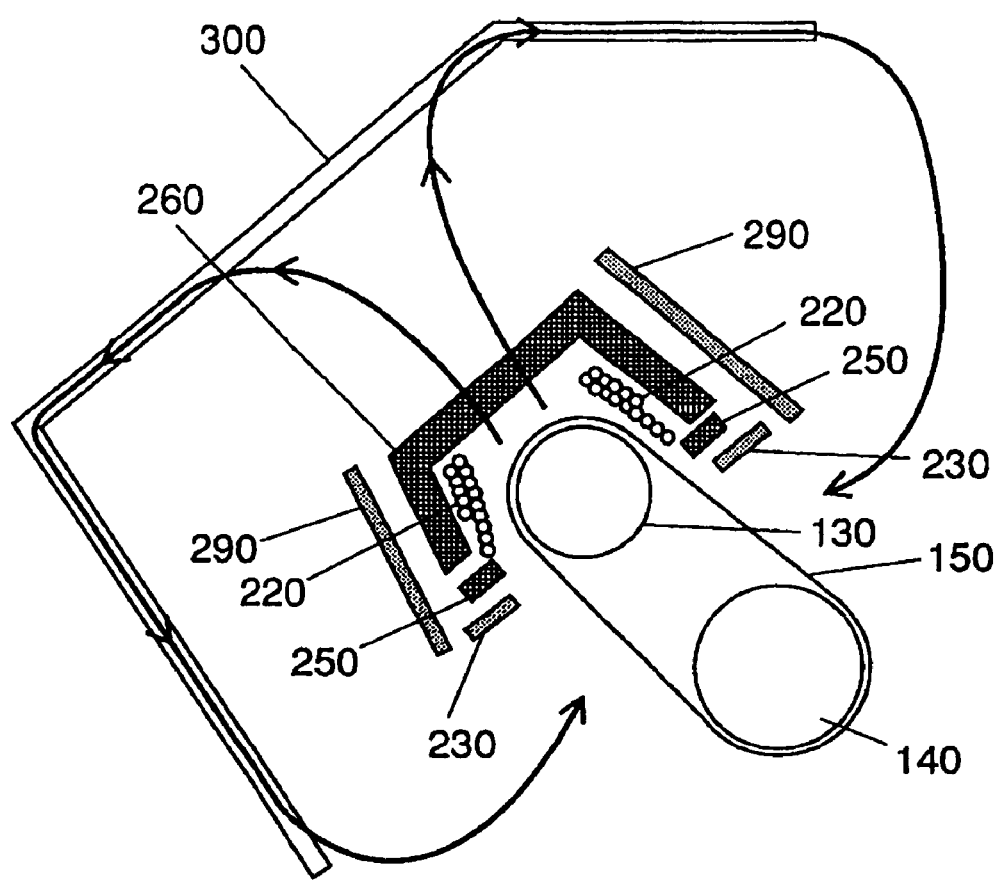
FIG. 8 is an explanatory view showing a change in a magnetic flux through a shielding plate in the induction heating means according to the embodiment of the invention.
Figure 9:
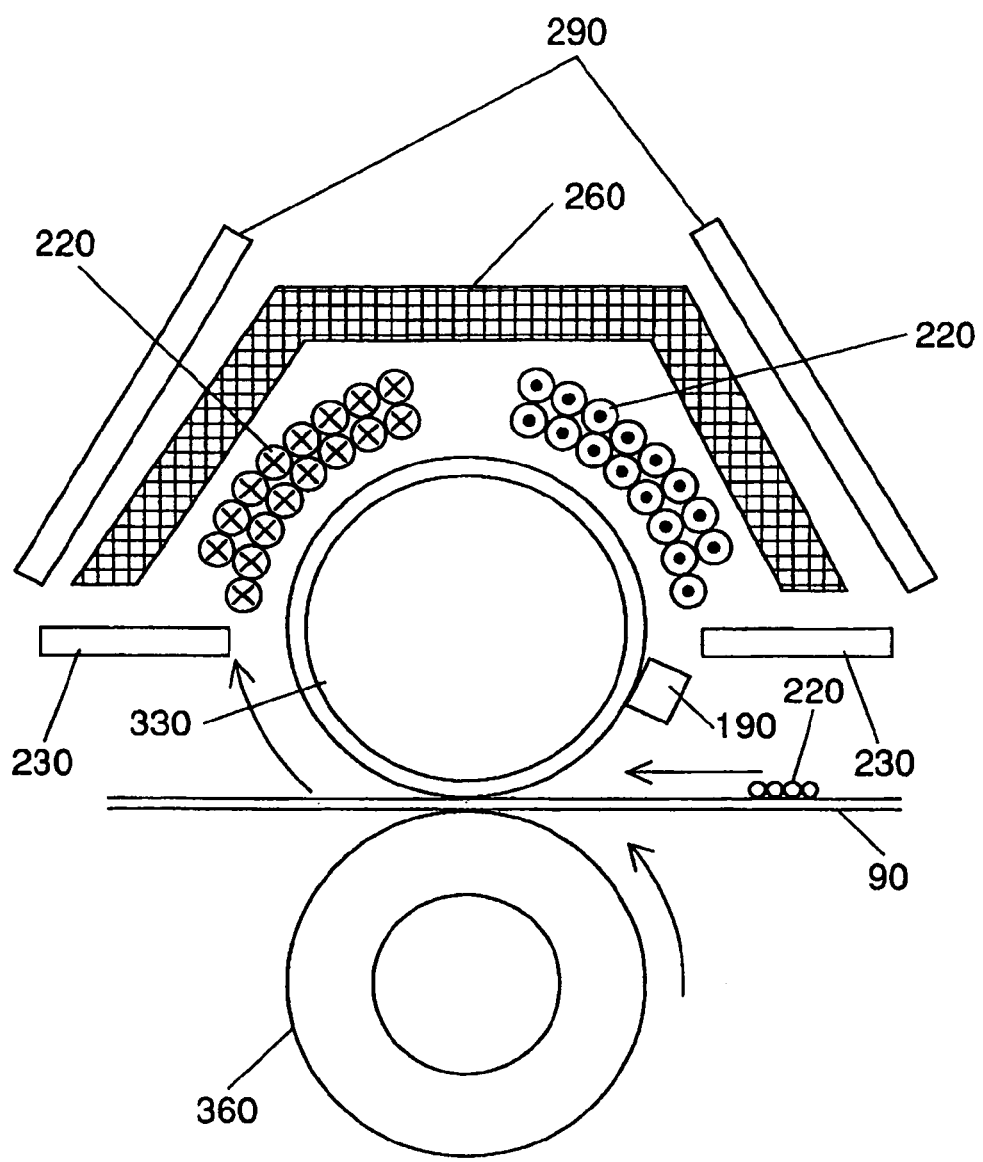
FIG. 9 is an explanatory view showing the structure of a fixing apparatus according to another embodiment of the invention.
Figure 10:
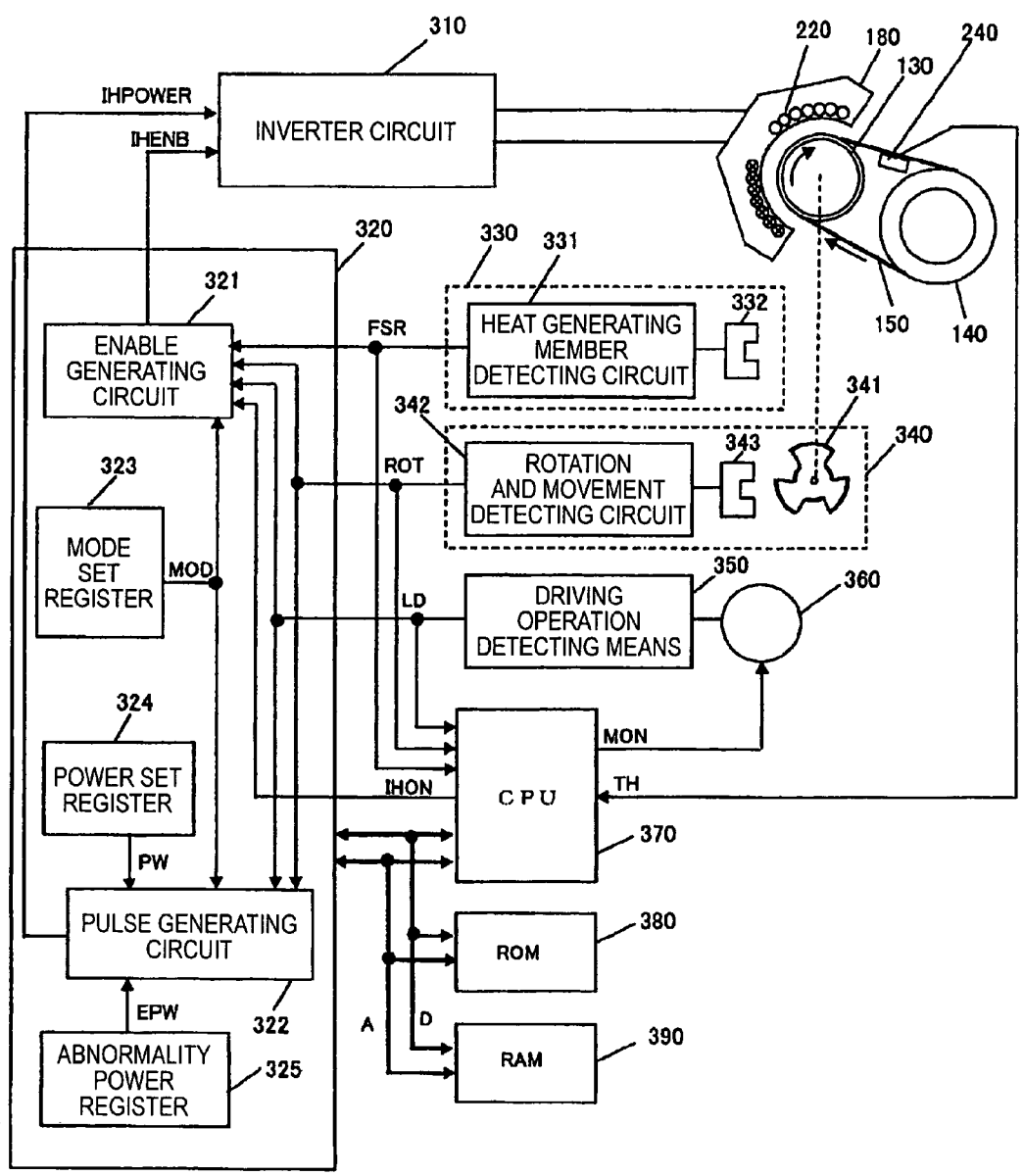
FIG. 10 is a block diagram showing an inverter circuit, a control circuit and peripheral circuits thereof in the fixing apparatus using the electromagnetic induction heating method according to the embodiment of the invention.
Figure 11:
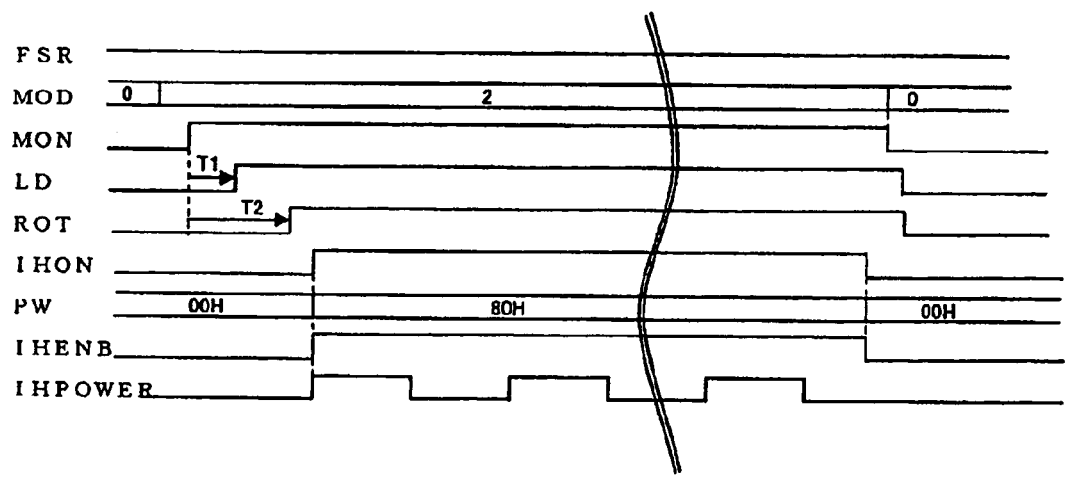
FIG. 11 is a timing chart showing an operation in printing by the electromagnetic induction heating method in FIG. 10.
Figure 12:
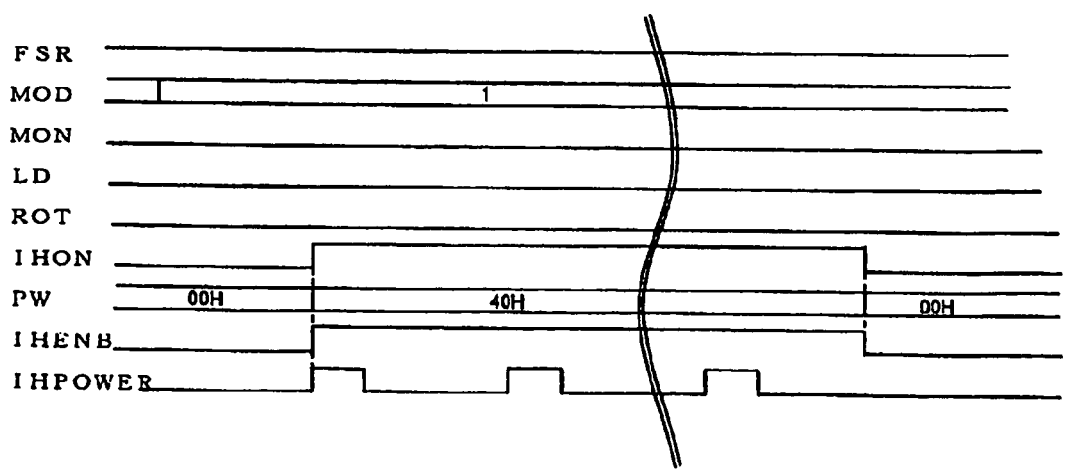
FIG. 12 is a timing chart showing an operation in a standby for the execution of heating by the electromagnetic induction heating method in FIG. 10.
Figure 13:
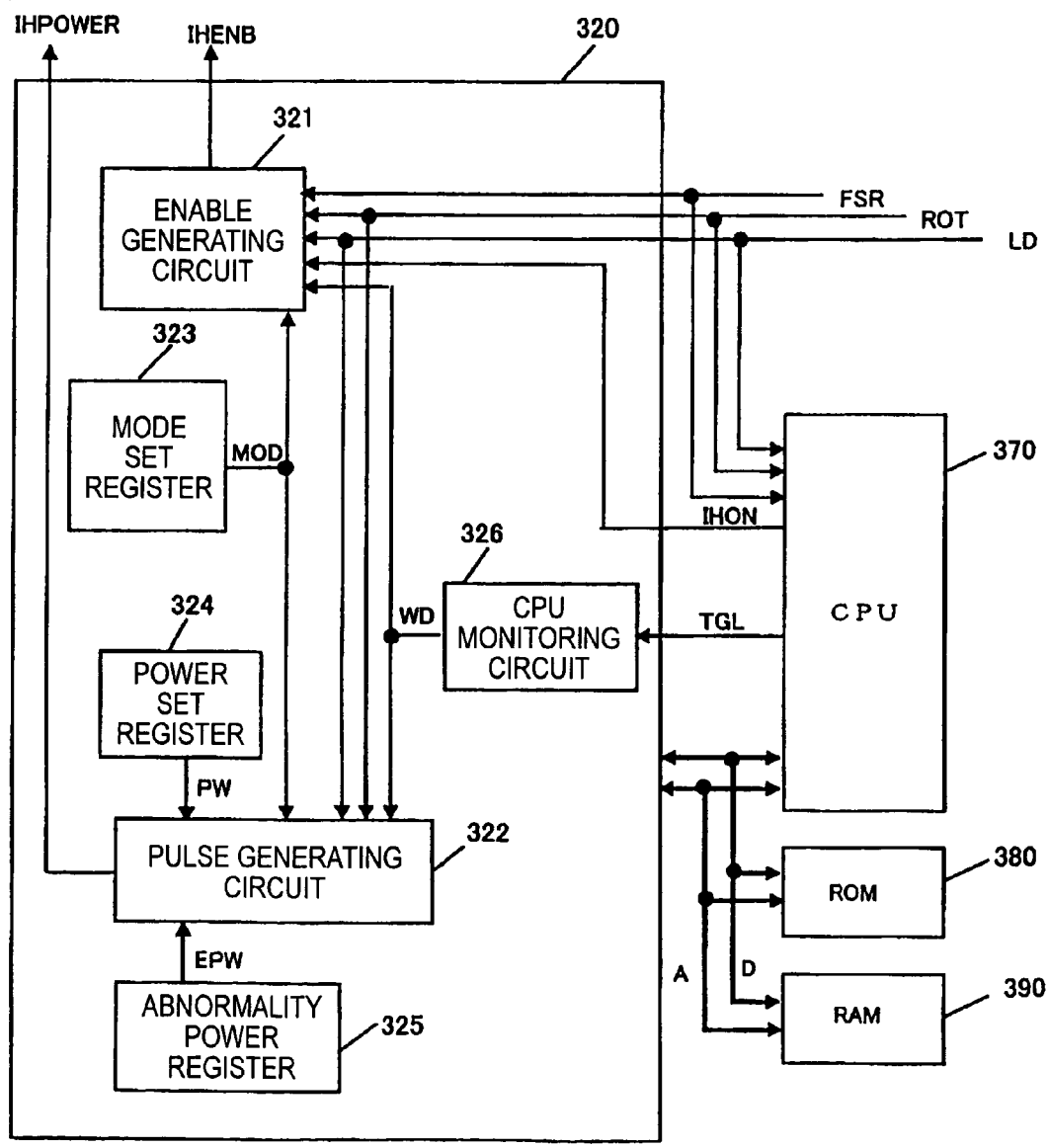
FIG. 13 is a block diagram showing a control circuit and peripheral circuits thereof in a fixing apparatus using an electromagnetic induction heating method according to the embodiment of the invention.

FIG. 1 is an explanatory view showing the structure of an image forming apparatus comprising a fixing apparatus according to an embodiment of the invention, FIG. 2 is an explanatory view showing the structure of the fixing apparatus according to the embodiment of the invention which is to be used in the image forming apparatus of FIG. 1, FIG. 3 is an explanatory view showing the structure of a heat roller constituting the fixing apparatus in FIG. 2, which is taken away, FIG. 4 is a view showing the structures of an exciting coil and a short ring which constitute the fixing apparatus in FIG. 2, FIG. 5 is an explanatory view showing the state of the magnetic flux of induction heating means according to the embodiment of the invention, FIG. 6 is an explanatory view showing a state in which the magnetic flux is cancelled by the short ring of the induction heating means according to the embodiment of the invention, FIG. 7 is an explanatory view showing a state in which the magnetic flux is cancelled by the short ring of the induction heating means according to the embodiment of the invention, FIG. 8 is an explanatory view showing a change in a magnetic flux through a shielding plate in the induction heating means according to the embodiment of the invention, FIG. 9 is an explanatory view showing the structure of a fixing apparatus according to another embodiment of the invention, FIG. 10 is an explanatory diagram showing the circuit of a power apparatus according to an embodiment of the invention, FIG. 11 is an explanatory diagram showing the operation of the power apparatus according to the embodiment of the invention, FIG. 12 is an explanatory diagram showing the operation of the power apparatus according to the embodiment of the invention, and FIG. 13 is an explanatory diagram showing the operation of the power apparatus according to the embodiment of the invention.

(1) Image Forming Apparatus

First of all, an image forming apparatus according to the invention will be schematically described. The image forming apparatus which will be described in the embodiment is of a tandem type in which a developing device is particularly provided for each of toners having four basic colors contributing to the color development of a color image in an apparatus employing an electrophotographic method and images having the four colors are superposed on a transfer member and are collectively transferred onto a sheet material.

However, it is apparent that the invention is not restricted to only the image forming apparatus of the tandem type but can be employed for image forming apparatuses of all types irrespective of the number of developing devices and the presence of an intermediate transfer member.

In FIG. 1, there are provided, around photosensitive drums 10a, 10b, 10c and 10d, charging means 20a, 20b, 20c and 20d for uniformly charging the surfaces of the photosensitive drums 10a, 10b, 10c and 10d to have a predetermined electric potential, exposing means 30 for irradiating scanning lines 30K, 30C, 30M and 30Y of a laser beam corresponding to image data having specific colors on the charged photosensitive drums 10a, 10b, 10c and 10d, thereby forming electrostatic latent images, developing means 40a, 40b, 40c and 40d for developing the electrostatic latent images formed on the photosensitive drums 10a, 10b, 10c and 10d, transfer means 50a, 50b, 50c and 50d for transferring toner images developed on the photosensitive drums 10a, 10b, 10c and 10d onto a non-end intermediate transfer belt (an intermediate transfer member) 70, and cleaning means 60a, 60b, 60c and 60d for removing a toner remaining on the photosensitive drums 10a, 10b, 10c and 10d after the toner images are transferred from the photosensitive drums 10a, 10b, 10c and 10d onto the intermediate transfer belt 70.

The exposing means 30 is provided with a predetermined inclination with respect to the photosensitive drums 10a, 10b, 10c and 10d. Moreover, the intermediate transfer belt 70 is rotated in a direction of an arrow A as shown in the drawing. In image forming stations Pa, Pb, Pc and Pd, a black image, a cyan image, a magenta image and a yellow image are formed respectively. Then, monochromatic images having respective colors which are formed on the photosensitive drums 10a, 10b, 10c and 10d are sequentially superposed and transferred onto the intermediate transfer belt 70 so that a full color image is formed.

A paper feeding cassette 100 accommodating a sheet material (a recording medium) 90 such as a printing paper is provided in the lower part of the apparatus. The sheet materials 90 are fed one by one from the paper feeding cassette 100 to a paper delivery path through a paper feeding roller 80.

On the paper delivery path are provided a transfer roller 110 for coming in contact with the outer peripheral surface of the intermediate transfer belt 70 in a predetermined amount and transferring a color image formed on the intermediate transfer belt 70 onto the sheet material 90, and a fixing device 120 for fixing the color image transferred onto the sheet material 90 to the sheet material 90 by a pressure and heat which are generated by the interposition and rotation of the roller.

Moreover, a door 125 forms a housing of the image forming apparatus and is opened and closed in the exchange of the fixing device 120 or the execution of a jam processing.

In the image forming apparatus having such a structure, first of all, a latent image having a black component color of image information is formed on the photosensitive drum 10a by the charging means 20a of the image forming station Pa and the exposing means 30. The latent image is changed into a visible image as a black toner image by the developing means 40a having a black toner through the developing means 40a and is transferred as the black toner image onto the intermediate transfer belt 70 through the transfer means 50a.

On the other hand, while the black toner image is transferred onto the intermediate transfer belt 70, a latent image having a cyan component color is formed in the image forming station Pb, and subsequently, a cyan toner image is developed by the developing means 40b. Then, the cyan toner image is transferred, by the transfer means 50b of the image station Pb, onto the intermediate transfer belt 70 onto which the black toner image is completely transferred in the former image station Pa, and is superposed on the black toner image.

A magenta toner image and a yellow toner image are also formed in the same manner. When toner images having four colors are completely superposed on the intermediate transfer belt 70, the toner images having the four colors are collectively transferred through the sheet material transfer roller 110 onto the sheet material 90 fed from the paper feeding cassette 100 by means of the paper feeding roller 80. The toner images thus transferred are heated and fixed to the sheet material 90 by means of the fixing device 120 so that a full color image is formed on the sheet material 90.

(2) Fixing Apparatus

Next, description will be given to the fixing apparatus used in the image forming apparatus.

As shown in FIG. 2, the fixing apparatus is constituted by a heat roller (a heat generating member) 130 to be heated by the electromagnetic induction of induction heating means 180, a fixing roller 140 provided in parallel with the heat roller 130, a non-end band-shaped heat resistant belt (toner heating medium) 150 provided over the heat roller 130 and the fixing roller 140, heated by the heat roller 130 and rotated in a direction of an arrow B by the rotation of at least one of these rollers, and a pressurizing roller 160 provided in pressure contact with the fixing roller 140 through the heat resistant belt 150 and rotated in a forward direction with respect to the heat resistant belt 150.

The heat roller 130 is formed by a rotating member to be a hollow and cylindrical magnetic metal member such as iron, cobalt, nickel or an alloy of these metals, for example, and has an outside diameter set to be 20 mm and a thickness set to be 0.3 mm, for example, and has a low heat capacity and a quick temperature rise.

As shown in FIG. 3, the heat roller 130 has both ends thereof supported rotatably by a bearing 132 fixed to a support side plate 131 formed of galvanized sheet iron. The heat roller 130 is rotated by the driving means of an apparatus body which is not shown. The heat roller 130 is constituted by a magnetic material to be an alloy of iron, nickel and chromium and is regulated to have a Curie point of 300° C. or more. Moreover, the heat roller 130 is formed to be pipe-shaped having a thickness of 0.3 mm.

In order to give a mold releasing property, the surface of the heat roller 130 is coated with a mold releasing layer (not shown) formed of fluororesin having a thickness of 20 μm. For the mold releasing layer, resin or rubber having an excellent mold releasing property, for example, PTFE, PFA, FEP, silicone rubber or fluorine-containing rubber may be used singly or they may be mixed. In the case in which the heat roller 130 is used for fixing a monochromatic image, it is preferable that only the mold releasing property should be maintained. In the case in which the heat roller 130 is used for fixing a color image, it is desirable that an elasticity should be given. In that case, it is necessary to form a thicker rubber layer.

The fixing roller 140 includes a metallic core bar 140a such as stainless steel, and an elastic member 140b which is obtained by bringing silicone rubber having a heat-resisting property into a solid or foaming condition and covering the core bar 140a. In order to form a fixing nip portion N having a predetermined width between the pressurizing roller 160 and the fixing roller 140 by a pressing force applied from the pressurizing roller 160, an outside diameter is set to be approximately 30 mm which is greater than that of the heat roller 130.

The elastic member 140b has a thickness of approximately 3 to 8 mm and a hardness of approximately 15 to 50 degrees (Asker hardness: JISA hardness of 6 to 25 degrees) By this structure, the heat capacity of the heat roller 130 is smaller than that of the fixing roller 140. Consequently, the heat roller 130 is rapidly heated so that a warm-up time is shortened.

The heat resistant belt 150 provided over the heat roller 130 and the fixing roller 140 is heated in a contact portion with the heat roller 130 to be heated by the induction heating means 180. Then, the internal surface of the heat resistant belt 150 is continuously heated by the rotation of the heat roller 130 and the fixing roller 140. As a result, the belt is wholly heated.

The heat resistant belt 150 is a composite layer belt constituted by a heat generating layer using, as a base material, a metal having a magnetic property such as iron, cobalt or nickel or an alloy having them as base materials, and a mold releasing layer (not shown) formed by an elastic member such as silicone rubber or fluorine-containing rubber which is provided to cover the surface of the heat generating layer.

By using the composite layer belt, the belt can be directly heated, and furthermore, a heat generating efficiency can be enhanced and a response can be carried out more quickly.

Even if a foreign substance enters a portion between the heat resistant belt 150 and the heat roller 130 to generate a gap for some reason, for example, the heat resistant belt 150 itself generates heat by heat generation caused by the electromagnetic induction of the heat generating layer of the heat resistant belt 150. Consequently, a temperature unevenness can be lessened and a fixing reliability can be enhanced.

In FIG. 2, the pressurizing roller 160 is constituted by a core bar 160a formed by a metallic cylindrical member having a high heat conducting property such as copper or aluminum, and an elastic member 160b having a high heat resistance and a high toner mold releasing property which is provided on the surface of the core bar 160a. In addition to the metals, SUS may be used for the core bar 160a.

The pressurizing roller 160 presses the fixing roller 140 through the heat resistant belt 150, thereby forming the fixing nip portion N for interposing and delivering the sheet material 90. In the embodiment, the hardness of the pressurizing roller 160 is set to be greater than that of the fixing roller 140 so that the pressurizing roller 160 cuts into the fixing roller 140 (and the heat resistant belt 150). By the cut-in, the sheet material 90 is provided in conformity with the circumferential shape of the surface of the pressurizing roller 160. Consequently, the sheet material 90 has the effect of easily separating from the surface of the heat resistant belt 150.

The pressurizing roller 160 has an outside diameter of approximately 30 mm which is equal to that of the fixing roller 140, and a thickness of approximately 2 to 5 mm which is smaller than that of the fixing roller 140 and a hardness of approximately 20 to 60 degrees (Asker hardness: JISA hardness of 6 to 25 degrees) which is greater than that of the fixing roller 140 as described above. The temperature of the internal surface of the belt is detected by temperature detecting means 240 comprising a temperature sensing unit having a high thermal responsiveness such as a thermistor provided in abutment on the internal surface side of the heat resistant belt 150 in the vicinity of the inlet side of the fixing nip portion N.

Next, the structure of the induction heating means 180 will be described.

The induction heating means 180 for heating the heat roller 130 by electromagnetic induction is provided opposite to the outer peripheral surface of the heat roller 130 as shown in FIG. 2. The induction heating means 180 is provided with a support frame (a coil guide member) 190 which is curved to cover the heat roller 130 and includes a storage chamber 200 for storing the heat roller 130. The support frame 190 is constituted by flame retardant resin.

A thermostat 210 is provided in the relative position of the support frame 190 to the heat roller 130, and a portion of the thermostat 210 which serves to detect a temperature is partially exposed from the support frame 190 toward the heat roller 130 and the heat resistant belt 150. Consequently, the temperatures of the heat roller 130 and the heat resistant belt 150 are detected and a power circuit (not shown) is forcibly disconnected when an abnormal temperature is detected.

An exciting coil 220 to be a wire bundle obtained by binding wires having surfaces insulated into bundles which serves as magnetic field generating means is wound upon the outer peripheral surface of the support frame 190. The exciting coil 220 is obtained by alternately winding one long exciting coil wire in the axial direction of the heat roller 130 along the support frame 190 (see FIG. 9). A length of the coil to be wound is set to be almost equal to that of a region in which the heat resistant belt 150 and the heat roller 130 come in contact with each other.

The exciting coil 220 is connected to a power apparatus (FIG. 10) in which an oscillating circuit has a variable frequency, and an alternating current having a high frequency of 10 kHz to 1 MHz, preferably an alternating current having a high frequency of 20 kHz to 800 kHz is supplied from the power apparatus (FIG. 10) so that an alternating field is generated. The alternating field acts on the heat roller 130 and the heat generating layer of the heat resistant belt 150 in a contact region of the heat roller 130 with the heat resistant belt 150 and a vicinal portion thereof, and an eddy current flows in such a direction as to hinder a change in the alternating field therein.

The eddy current generates Joule heat corresponding to the resistances of the heat roller 130 and the heat generating layer of the heat resistant belt 150, and the heat roller 130 and the heat resistant belt 150 are electromagnetically induced and heated mainly in the contact region of the heat roller 130 with the heat resistant belt 150 and the vicinal portion thereof.

As shown in FIG. 4, similarly, a short ring 230 is provided to surround the storage chamber 200 on the outside of the support frame 190. An eddy current is generated on the short ring 230 in such a direction as to cancel a leakage flux in a magnetic flux generated by the flow of a current to the exciting coil 220 which leaks to an outside. When the eddy current is generated, a magnetic field is generated in such a direction as to cancel the magnetic field of the leakage flux according to the Fleming's rule. Consequently, an unnecessary radiation can be prevented from being caused by the leakage flux.

It is assumed that the short ring 230 is formed by a material having a high conductiveness, for example, copper or aluminum. Moreover, it is preferable that the short ring 230 should be placed in at least a position in which a magnetic flux to cancel the leakage flux is generated.

An exciting coil core 250 is provided in such a configuration as to surround the storage chamber 200 of the support frame 190, and a C-type coil core 260 is provided across the storage chamber 200 of the support frame 190 thereabove.

The exciting coil core 250 and the C-type coil core 260 are provided so that the inductance of the exciting coil 220 is increased and the electromagnetic coupling of the exciting coil 220 and the heat roller 130 can be enhanced. Consequently, it is possible to put more power into the heat roller 130 with the same coil current. Thus, it is possible to implement a fixing apparatus having a warm-up time shortened.

A housing 270 for covering the inner part of the induction heating means 180 is attached to the opposite side of the heat roller 130 with the exciting coil 220 interposed therebetween. The housing 270 is formed of resin, for example, and is roof-shaped to cover the C-type coil core 260 and the thermostat 210 and is attached to the support frame 190. The housing 270 may be formed by a material other than the resin. The housing 270 is provided with a plurality of radiation holes 280 and heat emitted from the support frame 190, the exciting coil 220 and the C-type coil core 260 which are provided in the inner part is discharged to the outside.

A short ring 290 is attached to the support frame 190 in such a configuration as not to close the radiation holes formed on the housing 270.

The short ring 290 is the same as the short ring 230 and is positioned on the back face of the C-type coil core 260 as shown in FIG. 4, and an eddy current is generated in such a direction as to cancel a slight leakage flux leaking out of the back face of the C-type coil core 260 so that a magnetic field is generated in such a direction as to cancel the magnetic field of the leakage flux, thereby preventing an unnecessary radiation from being caused by the leakage flux.

A shielding plate 300 is attached to the opposite side of the heat roller 130 with the exciting coil 220 interposed therebetween.

The shielding plate 300 is formed of a ferromagnetic metal such as iron, and shields the leakage flux leaking out of the back face of the C-type coil core 260, thereby preventing the unnecessary radiation.

With reference to FIGS. 5 to 8, description will be given to a situation in which the short rings 230 and 290 cancel the leakage flux and a situation in which the shielding plate 300 shields a magnetic flux.

As shown in an arrow of FIG. 5, a magnetic flux generated by the exciting coil 220 through an alternating current flowing from an exciting circuit (not shown) penetrates through the inner part of the heat roller 130 in a circumferential direction due to the magnetism of the heat roller 130, thereby repeating generation and annihilation. By a change in the magnetic flux, an induced current generated on the heat roller 130 flows almost wholly to only the surface of the heat roller 130 by a skin effect, thereby generating the Joule heat.

However, all the magnetic fluxes are not applied to the heat roller to carry out heating, and some of them leak out.

As shown in FIG. 6, the short ring 230 generates a magnetic flux (shown in a dotted line) in such a direction as to cancel a magnetic flux (shown in a solid line) leaking from a clearance between the exciting coil 220 and the heat roller 130 toward the heat roller 130 side, thereby preventing an unnecessary radiation from being caused by the leakage flux.

As shown in FIG. 7, the short ring 290 generates a magnetic flux (shown in a dotted line) in such a direction as to cancel a magnetic flux (shown in a solid line) leaking from the exciting coil 220 toward the back face side of the C-type coil core 260, thereby preventing the unnecessary radiation from being caused by the leakage flux.

As shown in FIG. 8, the shielding plate 300 forms a closed magnetic circuit in such a manner that the magnetic flux (shown in the solid line) leaking from the exciting coil 220 to the back face side of the C-type coil core 260 does not leak toward an outside, thereby preventing the unnecessary radiation from being caused by the leakage flux.

While the short rings 230 and 290 and the shielding plate 300 produce the effects respectively, it is possible to suppress the unnecessary radiation from being caused by more leakage fluxes through a combination.

FIG. 9 is an explanatory view showing the structure of a fixing apparatus according to another embodiment of the invention.

While the fixing apparatus described with reference to FIG. 2 is obtained by using the induction heating means according to the invention for a fixing apparatus having such a structure as to carry out fixing through the heat resistant belt 150, it is easy to use induction heating means taking a countermeasure for a fixing apparatus utilizing no belt as shown in FIG. 9.

330 denotes a heat roller to be a heat generating member. The heat roller 330 is rotated by the driving means of an apparatus body which is not shown. The heat roller 330 is constituted by a magnetic material to be an alloy of iron, nickel and chromium and is regulated to have a Curie point of 300° C. or more. Moreover, the heat roller 130 is formed to be pipe-shaped having a thickness of 0.3 mm.

In order to give a mold releasing property, the surface of the heat roller 330 is coated with a mold releasing layer (not shown) formed of fluororesin having a thickness of 20 μm. For the mold releasing layer, resin or rubber having an excellent mold releasing property, for example, PTFE, PFA, FEP, silicone rubber or fluorine-containing rubber may be used singly or they may be mixed. In the case in which the heat roller 330 is used for fixing a monochromatic image, it is preferable that only the mold releasing property should be maintained. In the case in which the heat roller 330 is used for fixing a color image, it is desirable that an elasticity should be given. In that case, it is necessary to form a thicker rubber layer.

360 denotes a pressurizing roller to be pressurizing means. The pressurizing roller 360 is constituted by silicone rubber having a hardness of JISA 65 degrees and comes in pressure contact with the heat roller 330 by a pressing force of 20 kgf, thereby forming a nip portion. In this state, the pressurizing roller 360 is rotated with the rotation of the heat roller 330. For the material of the pressurizing roller 360, it is also possible to use another heat resistant resin or rubber such as fluorine-containing rubber or fluororesin. In order to enhance an abrasion resistance and a mold releasing property, moreover, it is desirable that the surface of the pressurizing roller 360 should be coated with resin such as PFA, PTFE or FEP or rubber, or their mixture. In order to prevent the radiation of heat, furthermore, it is desirable that the pressurizing roller 360 should be constituted by a material having a small heat conducting property.

Next, a control circuit 320 and peripheral structures thereof will be described with reference to FIG. 10.

The control circuit 320 is connected to heat generating member detecting means 330 for detecting that the fixing device 120 constituted by the heat roller 130, the fixing roller 140 and the heat resistant belt 150 is normally attached, rotation and movement detecting means 340 for detecting that the heat roller 130 or the heat resistant belt 150 is normally rotated, driving operation detecting means 350 for detecting that driving means for rotating the heat roller 130, the fixing roller 140 and the heat resistant belt 150 is normally operated, a CPU 370 for controlling the temperature of the fixing apparatus, and the inverter circuit 310.

Moreover, the control circuit 320 is constituted by an enable generating circuit 321 for generating a signal IHENB to control the enable/disable of the output of the inverter circuit 310, a pulse generating circuit 322 for generating a signal IHPOWER to control the output power of the inverter circuit 310, a mode set register 323 for determining a state in a standby, a power set register 324 for determining the output power of the inverter circuit 310, and an abnormality power register 325 for determining the output power of the inverter circuit 310 in an abnormality. The output of the inverter circuit 310 is set in a disable (stop) state when the signal IHENB is "0" or "Hi-Z", and is set in an enable state when the signal IHENB is "1". Moreover, the signal IHPOWER is a pulse signal and the output power of the inverter circuit 310 is determined by a ratio (duty) of a HIGH time to a LOW time. When the duty is higher (the HIGH time is longer than the LOW time), the output power is more increased. For example, the output power is approximately 300 W when the duty is 30%, and is approximately 800 W when the duty is 80%.

The mode set register 323 is a 2-bit register and data MOD thereof are written from the CPU 370 through a data bus D and an address bus A. When the data are "0", there is set a mode 0 indicative of a standby state in which heating is not carried out. When the data are "1", there is set a mode 1 indicative of a standby state in which the heating is carried out (a state in which the heating is carried out even if the heat roller 130 and the heat resistant belt 150 are not rotated). When the data are "2", there is set a mode 2 indicative of a printing state (in which the heating is carried out only when the heat roller 130 and the heat resistant belt 150 are normally rotated).

The enable generating circuit 321 outputs "0" or "1" to the signal IHENB by a signal IHON sent from the CPU 370, a signal FSR sent from the heat generating member detecting means 330, a signal ROT sent from the rotation and movement detecting means 340, a signal LD sent from the driving operation detecting means 350, and a signal MOD sent from the mode set register 323.

The power set register 324 is an 8-bit register and data PW thereof are written from the CPU 370 through the data bus D and the address bus A. When the data are larger, the output power of the inverter circuit is also higher. The abnormality power register 325 is an 8-bit register and data EPW thereof have a fixed value which has no problem in respect of safety even if the heating is carried out in a state in which the heat roller 130 and the heat resistant belt 150 are not rotated.

The pulse generating circuit 322 outputs a pulse signal to the signal IHPOWER by the signal ROT sent from the rotation and movement detecting means 340, the signal LD sent from the driving operation detecting means 350, the signal PW sent from the power set register 324, the signal EPW sent from the abnormality power register 325, and the signal MOD sent from the mode set register 323.

The heat generating member detecting means 330 is constituted by a heat generating member detecting circuit 331 and an optical sensor 332 such as a photointerruptor. In a state in which the fixing device 120 constituted by the heat roller 130, the fixing roller 140 and the heat resistant belt 150 is normally attached, the optical sensor 332 is brought into a light shielding state and the heat generating member detecting circuit 331 outputs "1" to the signal FSR. In a state in which the fixing device 120 is not normally attached, the optical sensor 332 is brought into a transmission state and the heat generating member detecting circuit 331 outputs "0" to the signal FSR.

The rotation and movement detecting means 340 is constituted by an encoder plate 341 to be rotated interlockingly with the heat roller 130 and the heat resistant belt 150, a rotation and movement detecting circuit 342, and an optical sensor 343 such as a photointerruptor. When the encoder plate 341 is rotated, the optical sensor 343 repeats a light shielding state and a transmission state. The rotation and movement detecting circuit 342 detects that the heat roller 130 and the heat resistant belt 150 are normally rotated and outputs "1" to the signal ROT when a repetition cycle is equal to or less than a predetermined time, and outputs "0" when the repetition cycle is more than the predetermined time.

Driving means 360 such as a DC brushless motor is rotated to drive the heat roller 130, the fixing roller 140 and the heat resistant belt 150 when a signal MON sent from the CPU 370 is "1", and is stopped when a signal MOT is "0". The driving operation detecting means 350 using a Hall sensor (not shown) outputs "1" to the signal LD for a period in which the driving means 360 is rotated at a predetermined number of rotations, and outputs "0" for other periods.

The CPU 370 controls the temperature of the fixing apparatus by an ROM 380 storing a program (software), an RAM 390 to be a work area and a signal TH sent from the temperature detecting means 240. Moreover, the CPU 370 can recognize the states of the signal FSR sent from the heat generating member detecting means 330, the signal ROT sent from the rotation and movement detecting means 340 and the signal LD sent from the driving operation detecting means 350 through the address bus A and the data bus D.

Next, the operation of the fixing apparatus in printing will be described with reference to FIG. 11 and (Table 1) to (Table 6).

FIG. 11 is a timing chart showing the operation of the fixing apparatus in the printing, (Table 1) to (Table 3) are tables indicative of the relationship between an input and an output in the enable generating circuit 321, and (Table 4) to (Table 6) are tables indicative of the relationship between an input and an output in the pulse generating circuit 322.

TABLE 1

When MOD = 0 is set

| Input FSR | LD | ROT | Output IHENB |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

TABLE 2

When MOD = 1 is set

| Input FSR | LD | ROT | Output IHENB |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | IHON |
| 1 | 0 | 1 | IHON |
| 1 | 1 | 0 | IHON |
| 1 | 1 | 1 | IHON |

TABLE 3

When MOD = 2 is set

| Input FSR | LD | ROT | Output IHENB |
|---|---|---|---|
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | IHON |

TABLE 4

When MOD = 0 is set

| Input LD | ROT | Output IHPOWER |
|---|---|---|
| 0 | 0 | 0 |
| 0 | 1 | 0 |
| 1 | 0 | 0 |
| 1 | 1 | 0 |

TABLE 5

When MOD = 1 is set

| Input LD | ROT | Output IHPOWER |
|---|---|---|
| 0 | 0 | Pulse corresponding to PW (which is not greater than EPW) |
| 0 | 1 | |
| 1 | 0 | |
| 1 | 1 | |

TABLE 6

When MOD = 2 is set

| Input LD | ROT | Output IHPOWER |
|---|---|---|
| 0 | 0 | 0 |
| 0 | 1 | 0 |
| 1 | 0 | 0 |
| 1 | 1 | Pulse corresponding to PW |

First of all, the CPU 370 confirms that the signal FSR sent from the heat generating member detecting means 330 is "1" and writes "2" to the mode set register 323 (the signal MOD is set to be "2"). When the signal FSR is "0", a printing operation is not carried out. Next, the CPU 370 sets, to "1", the signal MON to be sent to the driving means 360 so that the driving means 360 starts a rotation driving operation. When the driving means 360 reaches a predetermined number of rotations at a predetermined time T1, the driving operation detecting means 350 sets the signal LD to be "1". When the heat roller 130 and the heat resistant belt 150 are normally rotated after a predetermined time T2, the rotation and movement detecting means 340 sets the signal ROT to be "1". The CPU 370 confirms that both of the signals LD and ROT are "1", and sets the signal IHON to be "1", and furthermore, writes predetermined data (herein "80H") to the power set register 324.

The enable generating circuit 321 in the control circuit 320 outputs the same state as that of the signal IHON to the signal IHENB when all of the signals FSR, LD and ROT are "1" as shown in the (Table 3) in the case in which the signal MOD=2 is set (in the printing). Moreover, the pulse generating circuit 322 outputs a pulse corresponding to the signal PW to be the data set to the power set register 324 to the signal IHPOWER when all of the signals LD and ROT are "1" as shown in the (Table 6) in the case in which the signal MOD=2 is set (in the printing). In this case, "80H" is set to the power set register 324. Therefore, the signal IHPOWER becomes a pulse having a duty of 50%.

The inverter circuit 310 outputs a power in accordance with the duty of the signal IHPOWER because the signal IHENB is set in the enable state. In this case, the signal IHPOWER has the duty of 50%. Consequently, a power of approximately 500 W is output so that the heat roller 130 and the heat resistant belt 150 are heated.

When the final fixed sheet material 90 is delivered to a paper discharge tray (not shown), the CPU 370 sets the signal IHON to be "0" and writes "00H" to the power set register 324, and then, sets the signal MON to be "0", thereby stopping the driving means 360. Thus, the fixing operation is ended.

The CPU 370 confirms that the signal FSR is "1" and then enables the output of the inverter circuit 310, and furthermore, recognizes that an abnormality is generated to set the signal IHON to be "0" and writes "00H" to the power set register 324, thereby stopping the heating when the signal FSR is set to be "0" for some reason in the printing and heating (MOD=2). If the fixing device 120 is not normally attached, consequently, the output of the inverter circuit is stopped so that the leakable of an unnecessary electromagnetic wave can be prevented.

When the signal LD or the signal ROT is set to be "0" for some reason in the printing and heating (MOD=2), it is recognized that an abnormality is generated and the signal IHON is set to be "0", and furthermore, "00H" is written to the power set register 324, thereby stopping the heating. Consequently, the heat roller 130 and the heat resistant belt 150 can be hindered from being heated locally so that fuming and ignition can be prevented.

When the abnormality is generated, the control circuit 320 stops the heating in the same manner as the CPU 370 as shown in the (Table 3) and the (Table 6). In other words, when the abnormality is generated, the heating is stopped without software. Also in a state in which the CPU 370 does not stop the heating for some reason when the abnormality is generated, therefore, the heating can be stopped reliably.

Next, the operation of the fixing apparatus in a standby for carrying out the heating will be described with reference to FIG. 12 and the (Table 1) to the (Table 6).

First of all, the CPU 370 confirms that the signal FSR sent from the heat generating member detecting means 330 is "1" and writes "1" to the mode set register 323 (the signal MOD is "1"). Next, the signal IHON is set to be "1" and predetermined data (herein "40H") are written to the power set register 324. The heating in the standby state is carried out to retain the fixing apparatus at a temperature of approximately 100° C. and a low power is set.

The enable generating circuit 321 in the control circuit 320 outputs the same state as that of the signal IHON to the signal IHENB when the signal FSR is "1" as shown in the (Table 2) in case of the signal MOD=1 (the standby state in which the heating is carried out). Moreover, the pulse generating circuit 322 outputs a pulse corresponding to the signal PW to be data set to the power set register 324 to the signal IHPOWER irrespective of the state of the signals LD and ROT as shown in the (Table 5) in case of the signal MOD=1 (the standby state in which the heating is carried out). Even if the signal PW is set to have a greater value than the value of the signal EPW, the signal IHPOWER does not have a greater value than the value of the signal EPW. In the signal EPW, "50H" is set to be a fixed value. Moreover, "40H" is set to the power set register 324. Therefore, the signal IHPOWER becomes a pulse having a duty of 25%.

Since the IHENB is set in the enable state, the inverter circuit 310 outputs a power in accordance with the duty of the signal IHPOWER. In this case, the signal IHPOWER has the duty of 25%. Therefore, a power of approximately 250 W is output, and the heat roller 130 and the heat resistant belt 150 are heated.

Even if the CPU 370 sets a great value (for example, "FFH") to the power set register 324 for some reason, the control circuit 320 does not output a pulse having a greater value than the value of the signal EPW to the signal IHPOWER. In a state in which the heat roller 130 and the heat resistant belt 150 are not rotated, therefore, the heating is not carried out at a high power so that fuming and ignition can be prevented.

Next, a second embodiment of the invention will be described with reference to FIGS. 13 and 14 and (Table 7) to (Table 12).

FIG. 13 is a block diagram showing a control circuit and peripheral circuits thereof in a fixing apparatus using an electromagnetic induction heating method according to the second embodiment of the invention. FIG. 14 is a timing chart showing an operation in printing by the electromagnetic induction heating method in FIG. 13. The (Table 7) to the (Table 9) are tables indicative of the relationship between an input and an output in an enable generating circuit using the electromagnetic induction heating method according to the second embodiment of the invention. The (Table 10) to the (Table 12) are tables indicative of the relationship between an input and an output in a pulse generating circuit using the electromagnetic induction heating method according to the second embodiment of the invention.

TABLE 7

When MOD = 0 is set

| Input WD | FSR | LD | ROT | Output IHENB |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 0 |

TABLE 8

When MOD = 1 is set

| Input WD | FSR | LD | ROT | Output IHENB |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | IHON |
| 1 | 1 | 0 | 1 | IHON |
| 1 | 1 | 1 | 0 | IHON |
| 1 | 1 | 1 | 1 | IHON |

TABLE 9

When MOD = 2 is set

| Input WD | FSR | LD | ROT | Output IHENB |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | IHON |

TABLE 10

When MOD = 0 is set

| Input | | | Output |
|---|---|---|---|
| WD | LD | ROT | IHPOWER |
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | 0 |

TABLE 11

When MOD = 1 is set

| Input | | | Output |
|---|---|---|---|
| WD | LD | ROT | IHPOWER |
| 0 | 0 | 0 | 0 |
| 0 | 0 | 1 | 0 |
| 0 | 1 | 0 | 0 |
| 0 | 1 | 1 | 0 |
| 1 | 0 | 0 | Pulse corresponding to PW (which is not greater than EPW) |
| 1 | 0 | 1 | |
| 1 | 1 | 0 | |
| 1 | 1 | 1 | |

TABLE 12

When MOD = 2 is set

| Input | | | Output |
|---|---|---|---|
| WD | LD | ROT | IHPOWER |
| 0 | 0 | 0 | 0 |
| 0 | 0 | 1 | 0 |
| 0 | 1 | 0 | 0 |
| 0 | 1 | 1 | 0 |
| 1 | 0 | 0 | 0 |
| 1 | 0 | 1 | 0 |
| 1 | 1 | 0 | 0 |
| 1 | 1 | 1 | Pulse corresponding to PW |

Figure 14:
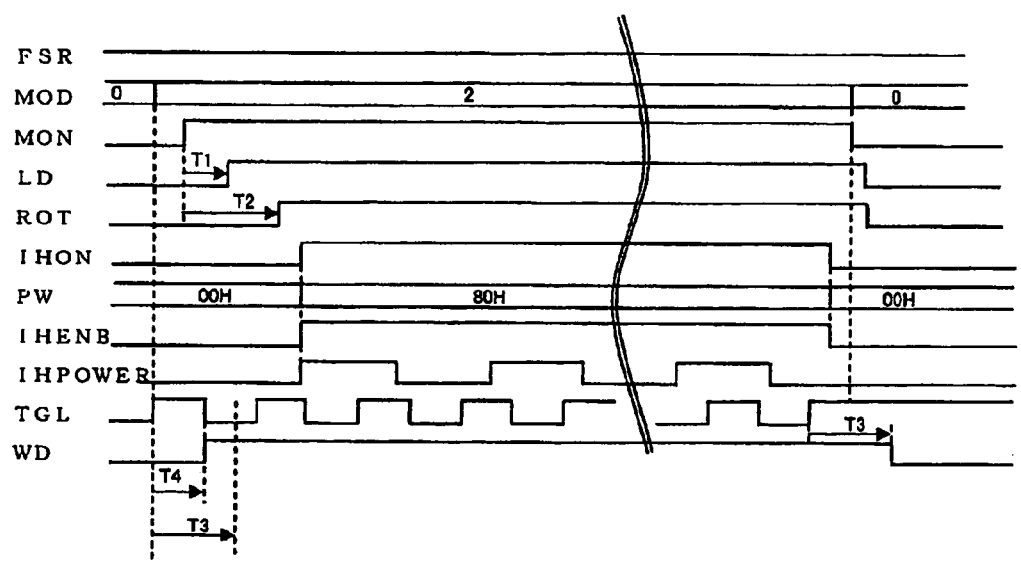
FIG. 14 is a timing chart showing an operation in printing by the electromagnetic induction heating method in FIG. 13.

In FIG. 14, a CPU monitoring circuit 326 monitors the state of a signal TGL, and outputs "1" to a signal WD when the state of the signal TGL is changed from "0" to "1" or from "1" to "0" in a predetermined time T3, and outputs "0" when the change is not carried out in the time T3.

An enable generating circuit 321 outputs a signal IHON as shown in the Table 1 of the first embodiment only when the signal WD is "1" as shown in the (Table 7) to the (Table 9). When the signal WD is "0", "0" is always output to the signal IHON.

A pulse generating circuit 322 outputs a signal IHPOWER as shown in the Table 2 of the first embodiment only when the signal WD is "1". When the signal WD is "0", "0" is always output to the signal IHPOWER.

Description will be given to the operation of the fixing apparatus in the printing.

First of all, a CPU 370 confirms that a signal FSP sent from heat generating member detecting means is "1" and writes "2" to a mode set register 323, and furthermore, brings the signal TGL into a different state from a current state. Herein, the signal TGL is changed from "0" to "1" and the state is then changed continuously everytime T4. The CPU monitoring circuit 326 outputs "1" to the signal "WD" when the state of the signal TGL is changed within the predetermined time T3 (the times T4 and T3 have a relationship of T4>T3).

Next, the CPU 370 sets, to "1", a signal MON to be sent to driving means 360 so that the driving means 360 starts a rotation driving operation. When the driving means 360 reaches a predetermined number of rotations at a predetermined time T1, driving operation detecting means 350 sets a signal LD to be "1". When a heat roller 130 and a heat resistant belt 150 are normally rotated after a predetermined time T2, rotation and movement detecting means 340 sets a signal ROT to be "1". The CPU 370 confirms that both of the signals LD and ROT are "1", and sets the signal IHON to be "1", and furthermore, writes predetermined data (herein "80H") to a power set register 324.

The enable generating circuit 321 in a control circuit 320 outputs the same state as that of the signal IHON to a signal IHENB when all of the signals WD, FSR, LD and ROT are "1" as shown in the (Table 9) in case of a signal MOD=2 (in the printing). Moreover, the pulse generating circuit 322 outputs a pulse corresponding to a signal PW to be the data set to the power set register 324 to the signal IHPOWER when all of the signals WD, LD and ROT are "1" as shown in the (Table 12) in case of the signal MOD=2 (in the printing). In this case, "80H" is set to the power set register 324. Therefore, the signal IHPOWER becomes a pulse having a duty of 50%.

An inverter circuit 310 outputs a power in accordance with the duty of the signal IHPOWER because the signal IHENB is set in an enable state. In this case, the signal IHPOWER has the duty of 50%. Consequently, a power of approximately 500 W is output so that the heat roller 130 and the heat resistant belt 150 are heated.

When a final fixed sheet material 90 is delivered to a paper discharge tray (not shown), the CPU 370 sets the signal IHON to be "0" and writes "00H" to the power set register 324. Then, the state of the signal TGL is stopped to be changed, and the CPU monitoring circuit 326 outputs "0" to the signal WD when the change in the state of the signal TGL is not carried out within T3. Furthermore, the CPU 370 sets the signal MON to be "0", thereby stopping the driving means 360. Thus, a fixing operation is ended.

The CPU monitoring circuit 326 always monitors the signal TGL. Even if the CPU 370 causes a runaway during printing and heating for some reason, therefore, the runaway is recognized so that the signals IHENB and IHPOWER are set to be "0" so that the heating is stopped. Thus, fuming and ignition can be prevented.

Next, a third embodiment of the invention will be described with reference to FIG. 15.

Figure 15:
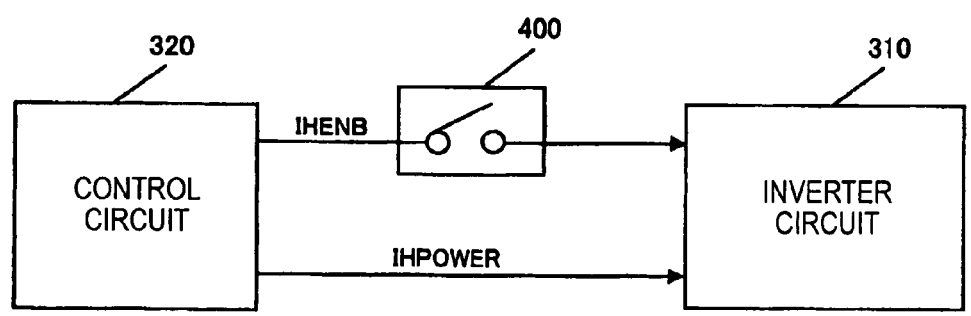
FIG. 15 is a block diagram showing a connection of an inverter circuit and a control circuit in a fixing apparatus using an electromagnetic induction heating method according to the embodiment of the invention.

FIG. 15 is a block diagram showing a connection of an inverter circuit and a control circuit in a fixing apparatus using an electromagnetic induction heating method according to the third embodiment of the invention.

A switch 400 is interlocked with the opening and closing operations of a door (not shown) to be used in the exchange of a fixing device. A signal IHENB output from a control circuit 320 is connected to an inverter circuit 310 through the switch 400. When the door (not shown) is opened (in the exchange of the fixing device), "Hi-Z" is set so that the inverter circuit 310 is brought into an output stop state. In a normal printing state, the door is maintained in a closing condition and the signal IHENB is transmitted to the inverter circuit 310 in an exact condition.

Thus, a connection of the control circuit 320 to the inverter circuit 310 is carried out through the switch 400 interlocked with the door in the exchange of the fixing device. When the switch 400 is set in the open condition (the door is opened), the output of the inverter circuit 310 is stopped so that a user can safely exchange the fixing device.

As described above, according to the invention, there are provided the driving operation detecting means for detecting that the driving means for driving the heat generating member is normally operated and the heat generating member rotation and movement detecting means for detecting that the heat generating member is normally rotated and moved, and the output of the inverter circuit is stopped or limited if one of the results of the detection is abnormal. Consequently, it is possible to obtain such an effective advantage that fuming and ignition can be prevented.

Moreover, there is provided the heat generating member detecting means for detecting that the fixing device (the heat generating member) is normally attached, and the output of the inverter circuit is stopped if the fixing device is not attached normally. Consequently, it is possible to obtain such an effective advantage that the leakage of an unnecessary electromagnetic wave can be prevented.

In addition, the control circuit carries out, without software, the stoppage or limitation of the output of the inverter circuit when one of the results of the detection obtained by the driving operation detecting means and the heat generating member rotation and movement detecting means is abnormal, and the stoppage of the output of the inverter circuit when the result of the detection of the heat generating member detecting means is abnormal. Consequently, it is possible to obtain such an effective advantage that the fuming and the ignition can be prevented more reliably.

Moreover, a software runaway is immediately detected to stop the output of the inverter circuit by always monitoring the state of software during heating. Consequently, it is possible to obtain such an effective advantage that the fuming and the ignition can be prevented also during the software runaway.

Furthermore, the connection of the inverter circuit and the control circuit thereof is carried out through the switch interlocked with the door in the exchange of the fixing device and the output of the inverter circuit is stopped when the switch is set in an open condition (the door is opened). Consequently, it is possible to obtain such an effective advantage that a user can safely exchange the fixing device.

Description will be given to the structures of the induction heating means and the inverter power circuit.

Figure 16:
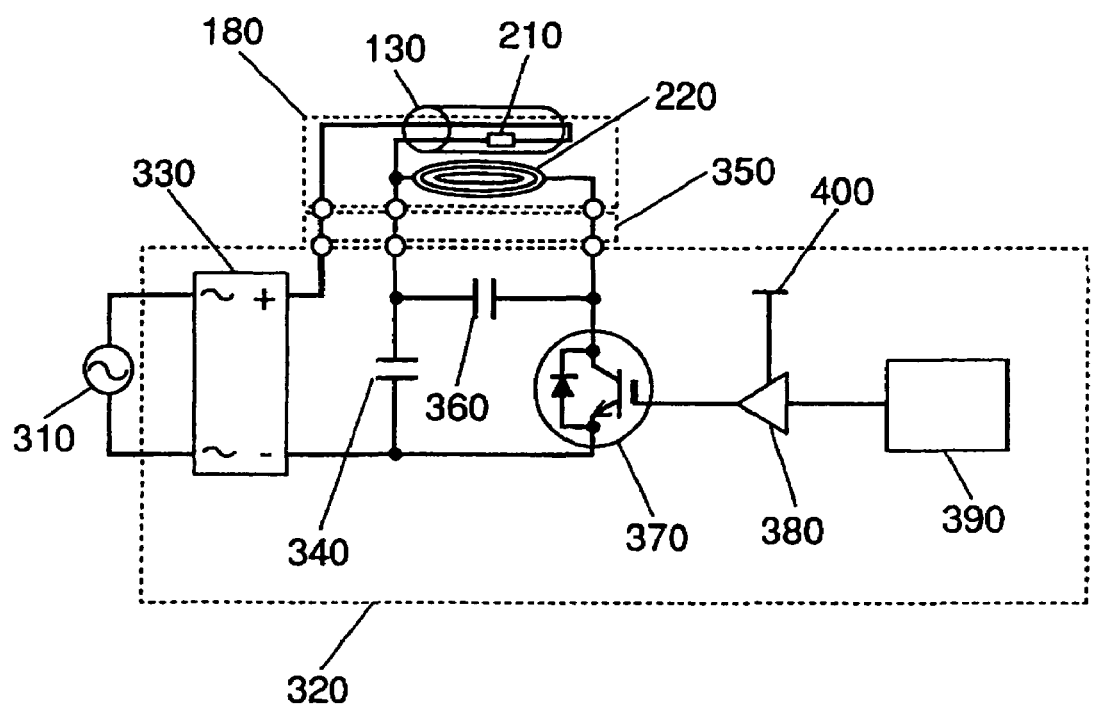
FIG. 16 is an electric block diagram showing induction heating means and an inverter power circuit in the fixing apparatus using the electromagnetic induction heating method according to the embodiment of the invention.

As shown in FIG. 16, a commercial power source 310 is connected to either side of the thermostat 210 in the induction heating means 180 by connecting means 350 through a rectifying diode 330 of a rectifying circuit for carrying out full wave rectification in the inverter power circuit 320, and either portion on the reverse side of the thermostat 210 is connected to either side of the exciting coil 220 in the induction heating means 180. Either side of each of the thermostat 210 and the exciting coil 220 which are connected is connected to a smoothing capacitor 340 of a smoothing circuit in the inverter power circuit 320 and a resonance capacitor 360 for resonance which is provided in parallel with the exciting coil 220 through the connecting means 350.

Furthermore, either portion on the reverse side of the exciting coil 220 is connected to a switching unit IGBT 370 in the inverter power circuit 320 through the connecting means 350. Moreover, the IGBT 370 is connected to switching unit driving means 380 and is ON/OFF controlled in response to the control signal of a temperature control circuit 390. A DC power source 400 having a DC of 20V is directly connected to the power source of the switching unit driving means 380.

The IGBT 370 is turned ON/OFF so that a high frequency current flows to the exciting coil 220. A magnetic field is generated by the high-frequency current and an eddy current is generated in the heat roller 130 to be a magnetic metal member provided opposite to the exciting coil 220, thereby generating Joule heat.

With such a circuit structure, the temperature of the heat roller 130 is controlled to be approximately 180° C. in a normal condition and both ends of the thermostat 210 are set in a short-circuit state.

When the temperature control does not act but a thermal runaway state is brought for some reason, the temperature of the heat roller 130 is rapidly raised so that the temperature of the thermostat 210 is also raised suddenly. When the rise in the temperature is continuously carried out so that the temperature of the thermostat 210 reaches 200° C. or more, both ends of the thermostat 210 are brought into an open-circuit state so that the supply of a power from the commercial power source 310 to the exciting coil 220 is directly cut off.

Next, description will be given to the connecting means 350 of the induction heating means 180 and the inverter power circuit 320.

Figure 17A:
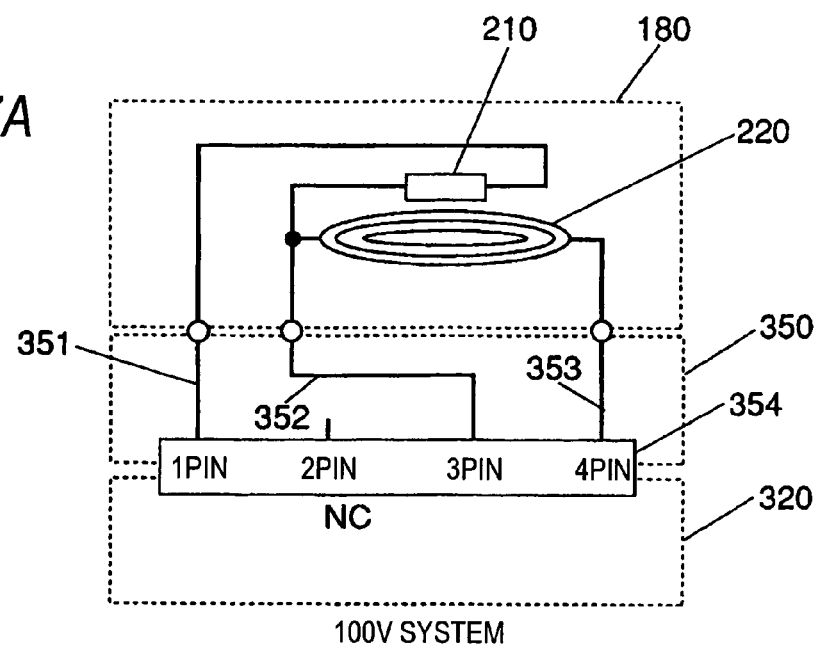
FIGS. 17A and 17B are diagrams showing a connector specification based on a supply voltage according to an embodiment of the invention in a connecting means portion of FIG. 16, FIGS. 18A and 18B are diagrams showing a connector specification based on a supply voltage according to another embodiment of the invention in the connecting means portion of FIG. 16.

As shown in FIG. 17A, for example, if the supply voltage of the commercial power source 310 is the induction heating means 180 of a 100V system, the connecting means 350 has lead wires 351, 352 and 353 and a connector 354, and the lead wire 351 connected to one of the terminals of the thermostat 210 is connected to a "1" pin of the connector 354. A "2" pin of the connector 354 is an idle pin (which will be hereinafter referred to as an NC pin).

Moreover, the lead wire 352 connected to the other terminal on the reverse side of the thermostat 210 and the exciting coil 220 is connected to a "3" pin of the connector 354, and the lead wire 353 connected to the other terminal on the reverse side of the exciting coil 220 is connected to a "4" pin of the connector 354.

If the supply voltage of the commercial power source 310 is the inverter power circuit 320 having a voltage of 100V, furthermore, a wiring pattern (not shown) in the inverter power circuit 320 has such a structure that the "1" pin has a pattern of the commercial power source 310, the "2" pin has no pattern, the "3" pin has patterns of the smoothing capacitor 340 and the resonance capacitor 360, and the "4" pin has a pattern of the IGBT 370 in the connector 354.

Figure 17B:
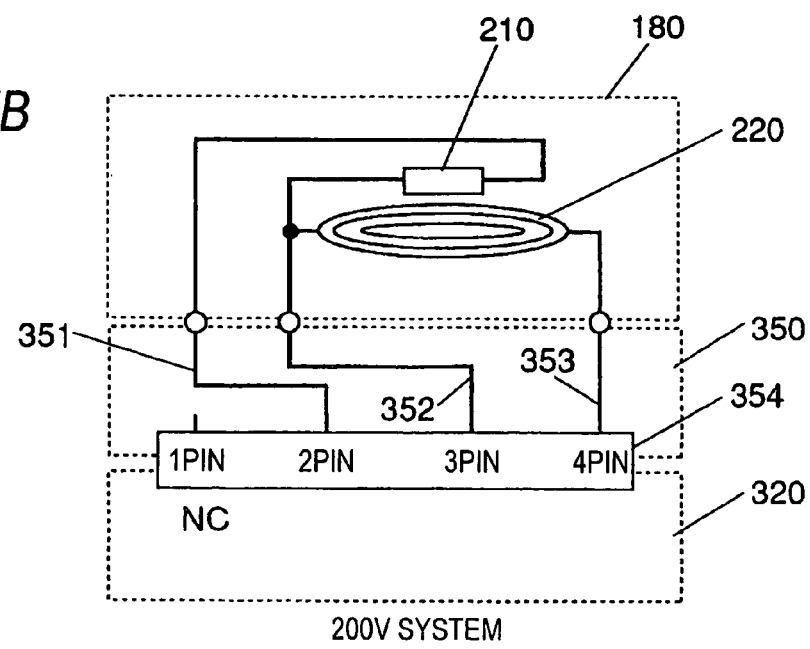

As shown in FIG. 17B, for example, if the supply voltage of the commercial power source 310 is the induction heating means 180 of a 200V system, the connecting means 350 has the lead wires 351, 352 and 353 and the connector 354, and the lead wire 351 connected to one of the terminals of the thermostat 210 is connected to the "2" pin of the connector 354. The "1" pin of the connector 354 is an idle pin (which will be hereinafter referred to as an NC pin). Thus, this connection is different from that of the 100V system.

Moreover, the lead wire 352 connected to the other terminal on the reverse side of the thermostat 210 and the exciting coil 220 is connected to the "3" pin of the connector 354, and the lead wire 353 connected to the other terminal on the reverse side of the exciting coil 220 is connected to the "4" pin of the connector 354. This connection is the same as that of the 100V system.

If the supply voltage of the commercial power source 310 is the inverter power circuit 320 having a voltage of 200V, furthermore, a wiring pattern (not shown) in the inverter power circuit 320 has such a structure that the "1" pin has no pattern, the "2" pin has the pattern of the commercial power source 310, the "3" pin has the patterns of the smoothing capacitor 340 and the resonance capacitor 360, and the "4" pin has the pattern of the IGBT 370 in the connector 354.

With the structure described above, even if the induction heating means 180 of the 100V system and the inverter power circuit 320 of the 200V system which have different supply voltages of the commercial power sources from each other are connected to the connector 354, the commercial power source 310 is not connected to the induction heating means 180 and the IGBT 370 in the inverter power circuit 320. The induction heating means 180 of the 200V system and the inverter power circuit 320 of the 100V system which have the different supply voltages of the commercial power source 310 from each other are constituted in the same manner.

Figure 18A:
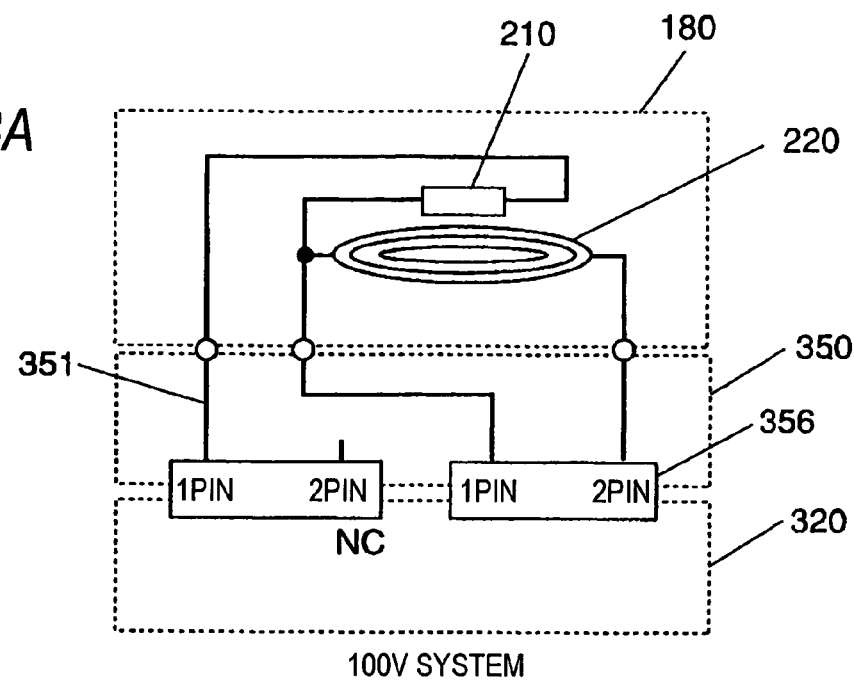
Figure 18B:
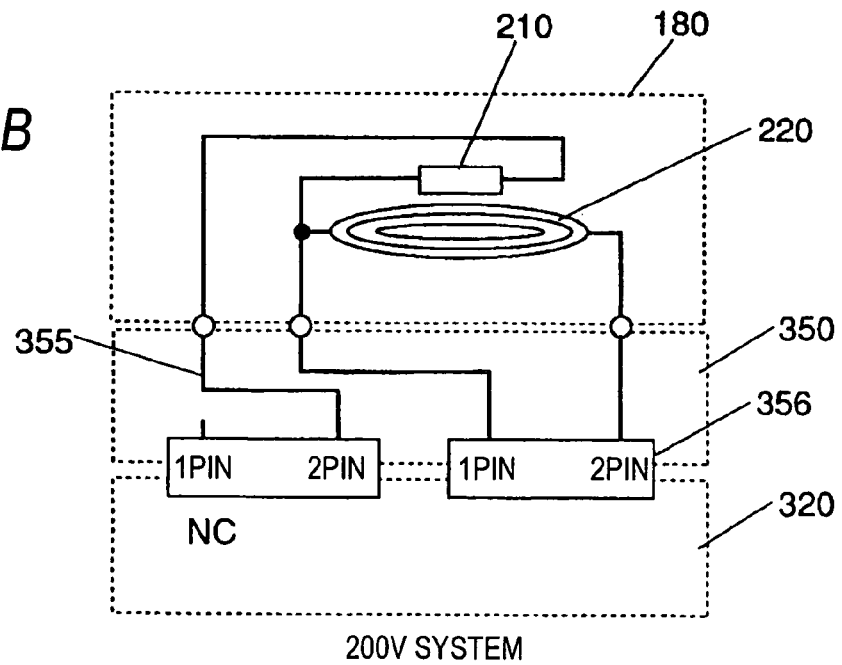

Even if two connectors 355 and 356 are provided in the connecting means 350 as shown in FIGS. 18A and 18B, moreover, the same structures and advantages can be obtained.

As described above, according to the invention, the abnormal temperature detecting means is electrically connected between the rectifying circuit and the smoothing circuit in the inverter power circuit, and the supply of a power to the exciting coil at an abnormal temperature is stopped by directly cutting off the commercial power line. Thus, it is possible to obtain such an effective advantage that fuming and ignition can be prevented.

Moreover, one of the two lead wires for connecting the exciting coil to the inverter power circuit and the two lead wires for connecting the abnormal temperature detecting means to the inverter power circuit is shared. Consequently, it is possible to obtain such an effective advantage that the number of the lead wires can be decreased and a cost can be thus reduced.

Furthermore, there is provided a connector containing at least four pins having two lead wires for connecting the exciting coil to the inverter power circuit and one lead wire for connecting the abnormal temperature detecting means to the inverter power circuit, and a connecting position of the connector having one lead wire for connecting the abnormal temperature detecting means to the inverter power circuit depending on a supply voltage is changed. Consequently, it is possible to obtain such an effective advantage that a power is not supplied to the exciting coil or the inverter power circuit so that the switching unit can be prevented from breaking down also in the case in which the exciting coil is taken for the inverter power circuit depending on the supply voltage.

Similarly, there are provided a connector containing two pins having two lead wires for connecting the exciting coil to the inverter power circuit and a connector containing at least two pins having one lead wire for connecting the abnormal temperature detecting means to the inverter power circuit, and a connecting position of the connector having one lead wire for connecting the abnormal temperature detecting means to the inverter power circuit depending on a supply voltage is changed. Consequently, it is possible to obtain such an effective advantage that a power is not supplied to the exciting coil or the inverter power circuit so that the switching unit can be prevented from breaking down also in the case in which the exciting coil is taken for the inverter power circuit depending on the supply voltage.

Figure 19:
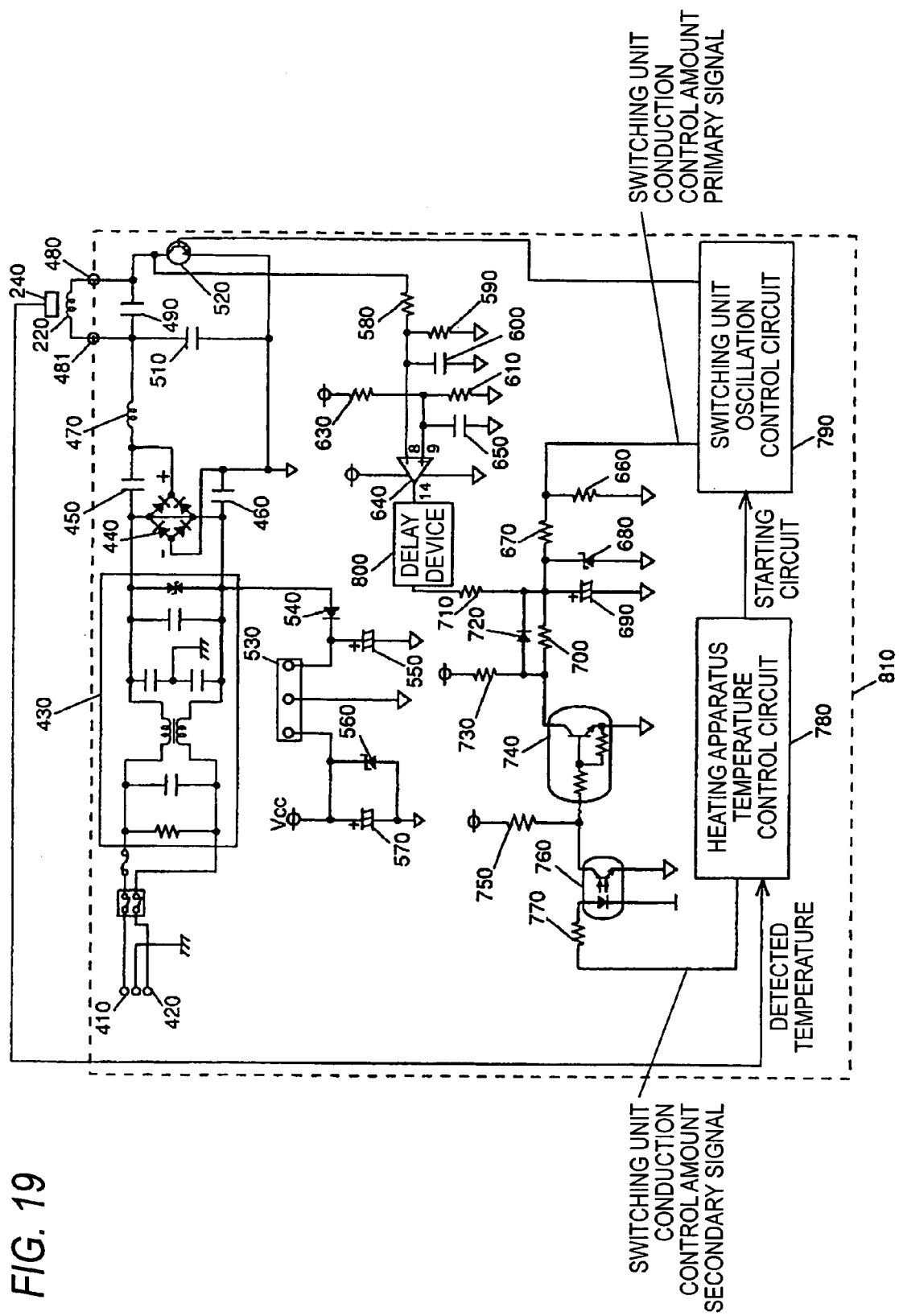
FIG. 19 is an explanatory diagram showing the circuit of a power apparatus according to an embodiment of the invention.

FIG. 19 is a diagram showing the structure of the circuit of a power apparatus 810 for supplying a power to the exciting coil 220 in the fixing apparatus.

Reference numeral 410 and 420 denote an input terminal for a commercial alternating voltage, 430 denotes an input filter and lightning protecting circuit block in the power apparatus, 440 denotes a double wave rectifying bridge, 450 and 460 denote a capacitor for preventing a noise, 470 denotes an inductor for preventing a noise, 510 denotes a smoothing capacitor for rectification, 490 denotes a resonance capacitor for constituting a resonance circuit together with the exciting coil 220, 520 denotes a switching unit for controlling conduction to the resonance circuit, 480 and 481 denote a terminal for connecting the power apparatus to the exciting coil 220 in the fixing apparatus, and 240 denotes temperature detecting means in the fixing apparatus.

Reference numeral 530 denotes a DC-DC converter IC for generating a supply voltage Vcc for operating the circuit in the power apparatus, 540 denotes a DC-DC converter IC input rectifying diode, 550 denotes a DC-DC converter IC input smoothing capacitor, 570 denotes a DC-DC converter IC output smoothing capacitor, and 560 denotes a Zener diode for limiting a DC-DC converter IC output overvoltage.

Reference numeral 580 and 590 denote a voltage dividing resistor for detecting a switching unit collector voltage, 620 denotes a capacitor for taking a countermeasure against a noise, 630 and 610 denote a voltage dividing resistor for generating a predetermined reference voltage from Vcc, 650 denotes a capacitor for taking a countermeasure against a noise, 640 denotes a comparator of an open collector for comparing the reference voltage with the switching unit collector voltage, and 800 denotes a delay device for delaying a 0V output of the comparator 640 by a constant time.

Reference numeral 780 denotes a heating apparatus temperature control circuit for controlling the constant temperature of the temperature detecting means 240, 760 denotes a photocoupler for primary and secondary insulation, 770 denotes a diode current limiting resistor of the photocoupler 760, 740 denotes a transistor for a voltage inversion, 750 and 730 denote a resistor for determining a voltage 700 denotes a resistor constituting a time constant circuit, 690 denotes a capacitor constituting the time constant circuit, 720 denotes a diode constituting the time constant circuit, 680 denotes a Zener diode for limiting a voltage generated by the time constant circuit with a certain value, 710 denotes a limiting resistor for connecting a voltage generated by the time constant circuit to the output of the delay device 800, 790 denotes a switching unit oscillation control circuit for controlling the oscillation of the switching unit 520, and 670 and 660 denote a voltage dividing resistor for connecting voltages generated by the switching unit oscillation control circuit and the time constant circuit.

An operation will be described with the structure described above. When a commercial alternating voltage is applied between the terminals 410 and 420, it passes through the input filter and lightning protecting circuit block 430 and is then rectified into a DC voltage by the double wave rectifying bridge 440, the capacitors 450 and 460 for preventing a noise, the inductor 470 for preventing a noise and the smoothing capacitor 510 for rectification. The DC voltage charged into the smoothing capacitor 510 is periodically applied to the resonance circuit constituted by the exciting coil 220 and the resonance capacitor 490 by the ON/OFF of the switching unit 520.

The rectifying diode 540 and the input smoothing capacitor 550 half wave rectify the commercial alternating voltage and then supply a DC voltage to the input terminal of the DC-DC converter IC 530, and the DC-DC converter IC 530 outputs the supply voltage Vcc for operating the circuit in the power apparatus to the smoothing capacitor 570. The Zener diode 560 carries out the overvoltage protection of Vcc.

The heating apparatus temperature control circuit 780 outputs a switching unit starting signal and a switching unit conduction control amount signal in such a manner that a temperature value sent from the temperature detecting means 240 is always a certain value. The switching unit starting signal changes the state of the switching unit oscillation control circuit 790 from a stop state to an operation state. A switching unit conduction control amount secondary signal is set to be an ON occupation amount of a constant periodic signal and turns ON/OFF the photocoupler 760 for primary and secondary insulation through the current limiting resistor 770, and furthermore, charges/discharges the time constant circuit constituted by the resistor 700, the diode 720 and the capacitor 690 through a voltage inverting circuit constituted by the resistors 750 and 730 for determining a voltage and the transistor 740 for a voltage inversion. Next, a switching unit collector applied voltage is divided by the voltage dividing resistors 580 and 590, and a noise is removed from the capacitor 620 for taking a countermeasure against a noise, and the divided voltage is then transmitted to the negative input terminal of the comparator 640. A predetermined voltage obtained by dividing the voltage Vcc through the voltage dividing resistors 630 and 610 is connected to the positive input terminal of the comparator 640 after a noise is removed therefrom through the capacitor 610 for taking a countermeasure against a noise. When the voltage of the negative terminal exceeds that of the positive terminal, the comparator 640 changes over an output open state into a 0V output and the delay time of the 0V output passes through the delay device 800 for 0 second to extract the electric charges of the capacitor 690 through the predetermined limiting resistance value 710, thereby dropping a voltage. Referring to the voltage of the capacitor 690 thus generated by such an operation, the switching unit conduction control amount primary signal is set to be a DC voltage amount and is transmitted to the switching unit oscillation control circuit 790 through the Zener diode 680 for an overvoltage limitation and the voltage dividing resistors 670 and 660. The switching unit oscillation control circuit 790 switched from the stop state to the operation state by the starting signal ON/OFF controls the switching unit 520 in accordance with the switching unit conduction control amount primary signal.

Figure 20:
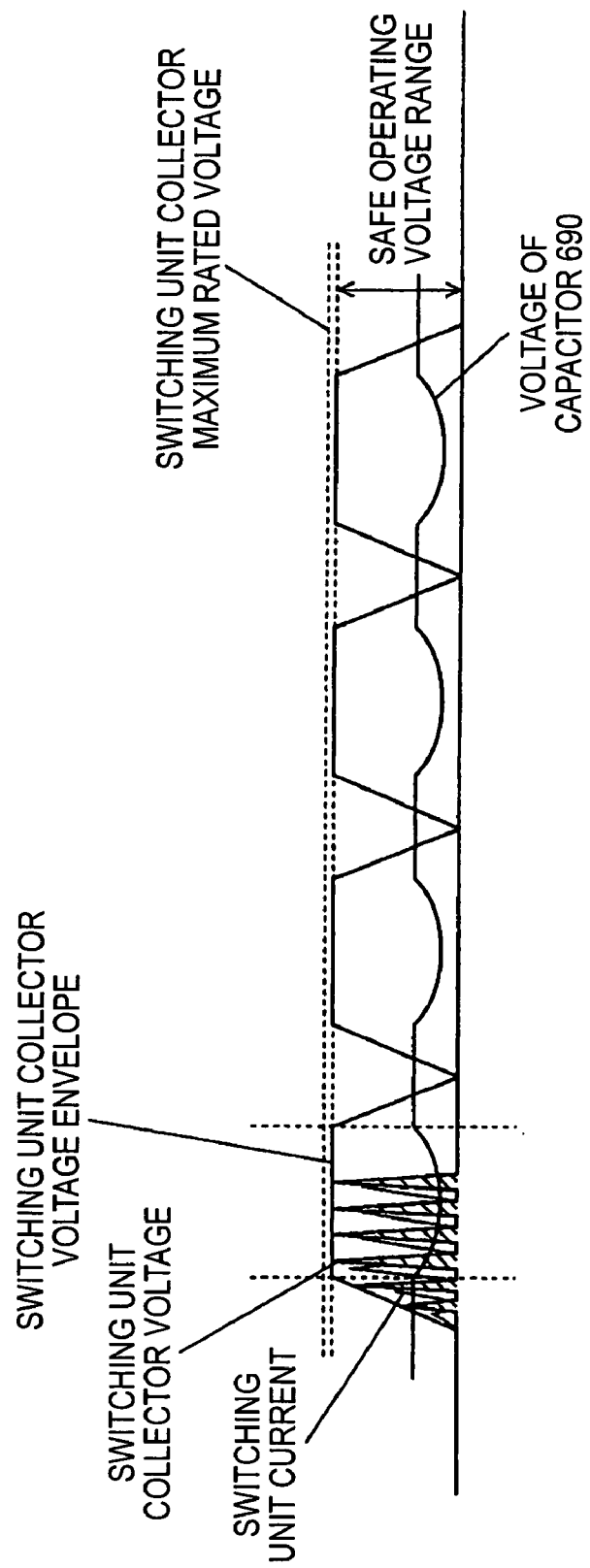
FIG. 20 is an explanatory diagram showing the operation of the power apparatus according to the embodiment of the invention.

FIG. 20 shows the operation waveform of the circuit thus operated. When the switching unit collector applied voltage exceeds a predetermined safe operation range, the voltage of the capacitor 690 for determining the switching unit conduction control amount is dropped by the operation and the amount of conduction of the exciting coil 220 is reduced. As a result, the switching unit collector applied voltage maintains a predetermined safe operating voltage range limitation to be horizontal.

Figure 21:
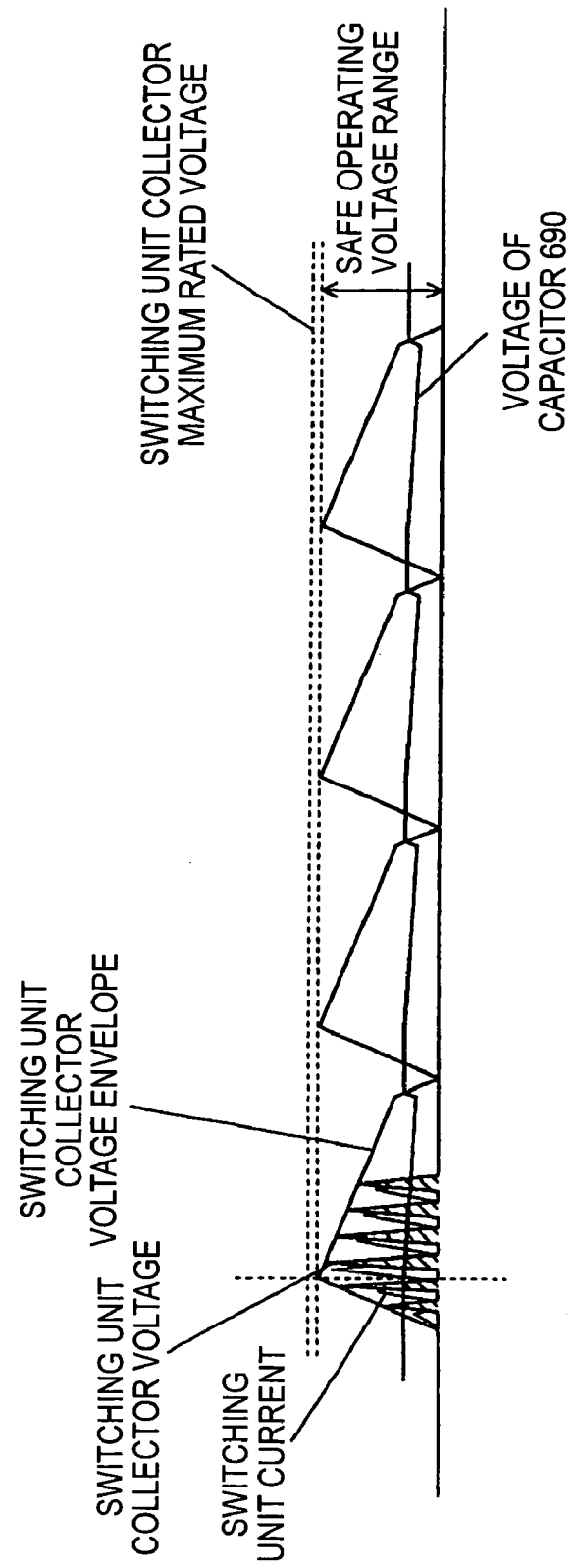
FIG. 21 is an explanatory diagram showing the operation of the power apparatus according to the embodiment of the invention.

When a 0V delay time of the delay device 800 is set to be a time corresponding to a half wave of the commercial alternating voltage and the value of the limiting resistance value 710 is set to be smaller than that described above, moreover, a drop in the voltage of the capacitor 690 is forcibly promoted as shown in FIG. 21 so that the amount of conduction of the exciting coil 220 can be further reduced. This is an effective choice when a power to be supplied to the exciting coil is to be regulated to be further reduced while maintaining the switching unit collector applied voltage within the safe operation range.

Figure 22:
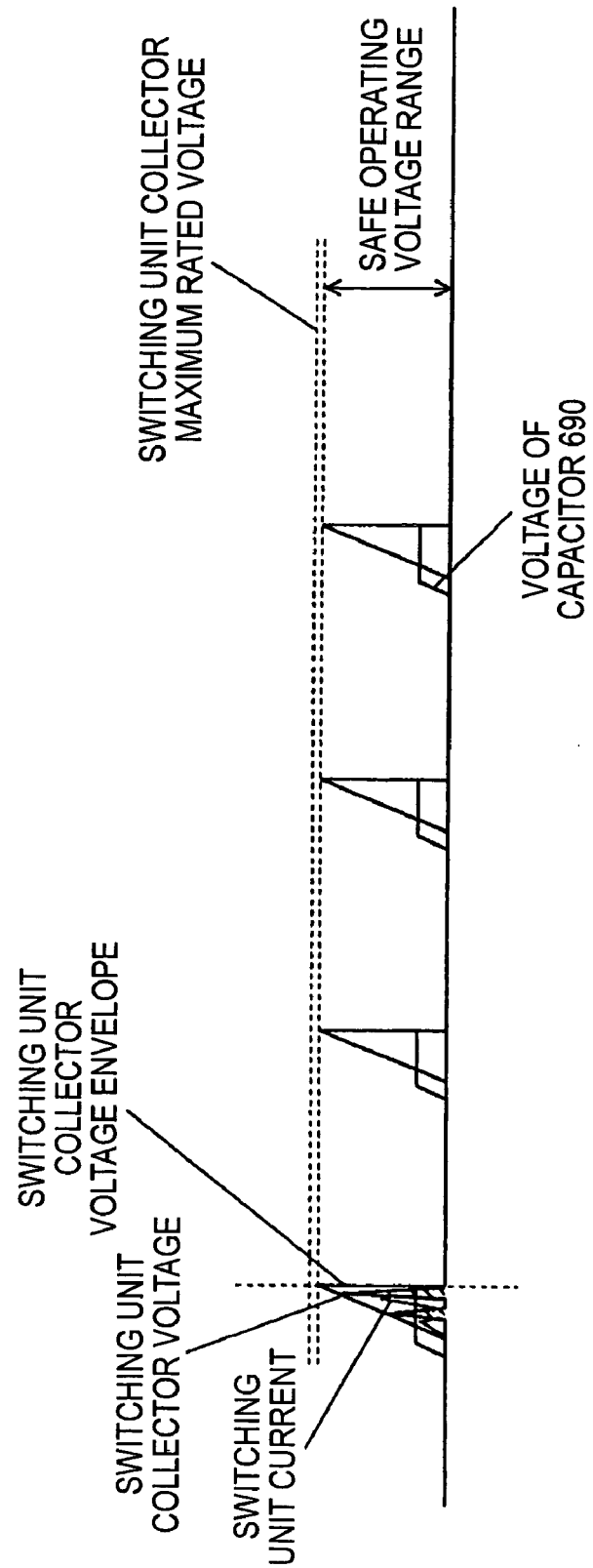
FIG. 22 is an explanatory diagram showing the operation of the power apparatus according to the embodiment of the invention.

When the 0V delay time of the delay device 800 is set to be the time corresponding to the half wave of the commercial alternating voltage and the value of the limiting resistance value 710 is set to be 0Ω, furthermore, the drop in the voltage of the capacitor 690 is promoted up to a limit as shown in FIG. 22 so that the amount of conduction of the exciting coil 220 can be reduced to a limit. This is an effective choice when a power to be supplied to the exciting coil is to be reduced to a limit while maintaining the switching unit collector applied voltage within the safe operation range.

According to the operation, an instantaneous control drawback caused by an external noise and an internal generated noise in the operation of a circuit, and furthermore, a variation in an intrinsic inductance value and an intrinsic resistance value in the fixing apparatus lead to a fluctuation in the switching unit collector applied voltage. Even if the switching unit collector applied voltage tries to exceed the switching unit collector maximum rated voltage, it is automatically restricted into a predetermined safe operating voltage range set to be the maximum rated voltage or less. Therefore, the safe operating voltage range can easily be managed with high precision and it is not necessary to inadvertently take a high degree of margin from the maximum rated voltage. Consequently, it is possible to set the safe operating voltage range of the switching unit to be close to the intrinsic maximum rated voltage of the switching unit as much as possible, thereby considerably reducing the margin of a voltage which has conventionally been maintained. Consequently, it is possible to select a switching unit having a low maximum rated voltage and to reduce the price of the switching unit, thereby contributing to corporate profits.

Figure 23:
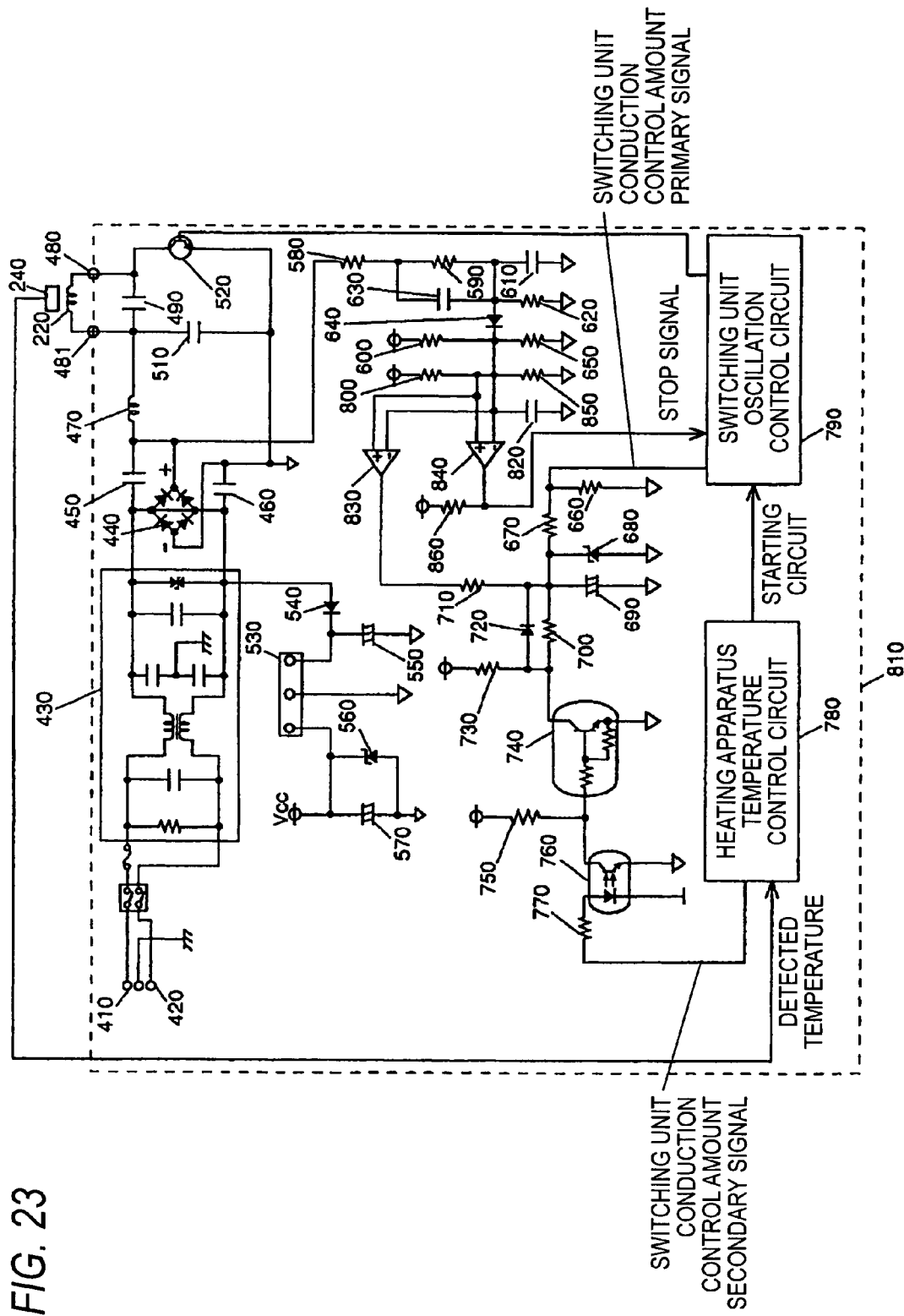
FIG. 23 is an explanatory diagram showing the circuit of a power apparatus according to an embodiment of the invention.

FIG. 23 is a diagram showing another structure of the circuit of a power apparatus 810 for supplying a power to the exciting coil 220 in the fixing apparatus.

In FIG. 23, 410 and 420 denote an input terminal for a commercial alternating voltage, 430 denotes an input filter and lightning protecting circuit block in the power apparatus, 440 denotes a double wave rectifying bridge, 450 and 460 denote a capacitor for preventing a noise, 470 denotes an inductor for preventing a noise, 510 denotes a smoothing capacitor for rectification, 490 denotes a resonance capacitor for constituting a resonance circuit together with the exciting coil 220, 520 denotes an IGBT to be a switching unit for controlling conduction to the resonance circuit, 480 and 481 denote a terminal for connecting the power apparatus 810 to the exciting coil 220 in the fixing apparatus, and 240 denotes temperature detecting means in the fixing apparatus.

Figure 25:
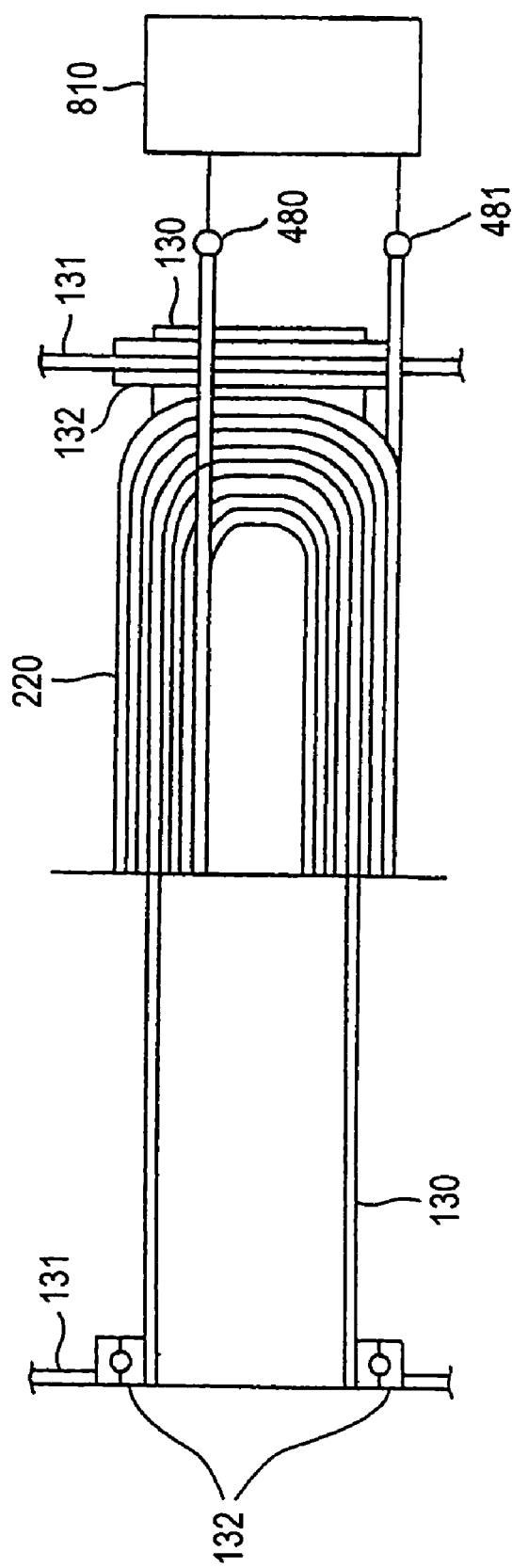
FIG. 25 is a diagram showing a connection structure between the exciting coil and the power apparatus.
Figure 26:
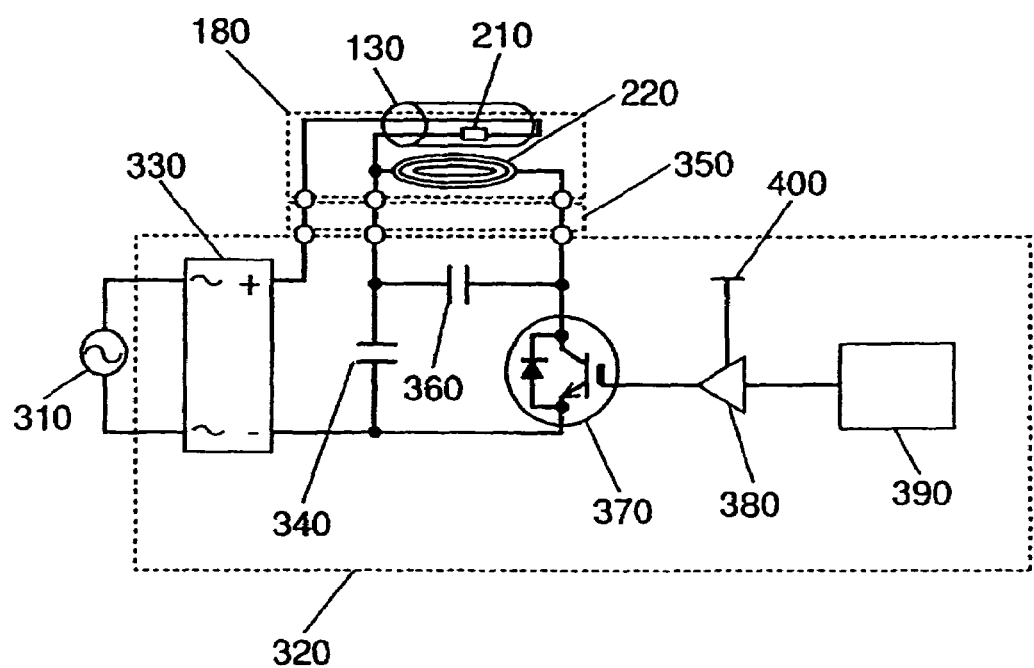
FIG. 26 is an electric block diagram showing induction heating means and an inverter power circuit in a fixing apparatus using an electromagnetic induction heating method according to the conventional art.

Connection structure between the exciting coil 220 and the power apparatus 810 is shown in FIG. 25.

Reference numeral 530 denotes a DC-DC converter IC for generating a supply voltage Vcc for operating the circuit in the power apparatus, 540 denotes a DC-DC converter IC input rectifying diode, 550 denotes a DC-DC converter IC input smoothing capacitor, 570 denotes a DC-DC converter IC output smoothing capacitor, and 560 denotes a Zener diode for limiting a DC-DC converter IC output overvoltage.

Reference numeral 580, 590 and 620 denote a voltage dividing resistor for detecting a DC voltage after smoothing a commercial alternating voltage, 610 denotes a capacitor for taking a countermeasure against a noise, 630 denotes a speed-up capacitor for detecting a sharp rising fluctuation of the DC voltage after smoothing the commercial alternating voltage, 640 denotes a diode for rectifying a voltage detected by the detecting component, 820 denotes a capacitor for rectifying a voltage detected by the detecting component, 600 and 650 denote a voltage dividing resistor for creating a bias voltage to raise the sensitivity of the detection, 800 and 850 denote a voltage dividing resistor for creating a reference voltage from the supply voltage Vcc, 830 and 840 denote a comparator of an open collector for comparing the reference voltage with a voltage detected by the detecting component, and 860 denotes a resistor for determining a voltage.

Reference numeral 780 denotes a heating apparatus temperature control circuit for controlling the constant temperature of the temperature detecting means 240, 760 denotes a photocoupler for primary and secondary insulation, 770 denotes a diode current limiting resistor of the photocoupler 760, 740 denotes a transistor for a voltage inversion, 750 and 730 denote a resistor for determining a voltage, 700 denotes a resistor constituting a time constant circuit, 690 denotes a capacitor constituting the time constant circuit, 720 denotes a diode constituting the time constant circuit, 680 denotes a Zener diode for limiting a voltage generated by the time constant circuit with a certain value, 710 denotes a limiting resistor for connecting a voltage generated by the time constant circuit to the output of the comparator 830, 790 denotes a switching unit oscillation control circuit for controlling the oscillation of the switching unit 520, and 670 and 660 denote a voltage dividing resistor for connecting voltages generated by the switching unit oscillation control circuit 790 and the time constant circuit.

An operation will be described with the structure described above. When a commercial alternating voltage is applied between the input terminals 410 and 420, it passes through the input filter and lightning protecting circuit block 430 and is then rectified into a DC voltage by the double wave rectifying bridge 440, the capacitors 450 and 460 for preventing a noise, the inductor 470 for preventing a noise and the smoothing capacitor 510 for rectification. The DC voltage charged into the smoothing capacitor 510 is periodically applied to the resonance circuit constituted by the exciting coil 220 and the resonance capacitor 490 by the ON/OFF of the switching unit 520.

The DC-DC converter IC input rectifying diode 540 and the DC-DC converter input smoothing capacitor 550 half wave rectify the commercial alternating voltage and then supply a DC voltage to the input terminal of the DC-DC converter IC 530, and the DC-DC converter IC 530 outputs the supply voltage Vcc for operating the circuit in the power apparatus to the smoothing capacitor 570 for a DC-DC converter output overvoltage control. The Zener diode 560 for a DC-DC converter output overvoltage control carries out the overvoltage protection of Vcc.

The heating apparatus temperature control circuit 780 outputs a switching unit starting signal and a switching unit conduction control amount secondary signal in such a manner that a temperature value sent from the temperature detecting means 240 is always a certain value. The switching unit starting signal changes the state of the switching unit oscillation control circuit 790 from a stop state to an operation state. The switching unit conduction control amount secondary signal is set to be an ON occupation amount of a constant periodic signal and turns ON/OFF the photocoupler 760 for primary and secondary insulation through the diode current limiting resistor 770, and furthermore, charges/discharges the time constant circuit constituted by the resistor 700, the diode 720 and the capacitor 690 through a voltage inverting circuit constituted by the resistors 750 and 730 for determining a voltage and the transistor 740 for a voltage inversion. Referring to the voltage of the capacitor 690 thus generated by such an operation, the switching unit conduction control amount primary signal is set to be a DC voltage amount and is transmitted to the switching unit oscillation control circuit 790 through the Zener diode 680 for an overvoltage limitation and the voltage dividing resistors 670 and 660. The switching unit oscillation control circuit 790 switched from the stop state to the operation state by the starting signal ON/OFF controls the switching unit 520 in accordance with the switching unit conduction control amount primary signal.

Next, an excessive surge voltage of the DC voltage smoothed by the double wave rectifying bridge 440 and a sharp fluctuation in a voltage are divided by the voltage dividing resistors 580, 590 and 620 and a noise is removed by the capacitor 610 for taking a countermeasure against a noise, and furthermore, they are then half wave rectified by the diode 640 and the capacitor 820 and are transmitted to the negative terminals of the comparators 830 and 840 in a superposing configuration on a bias resistance created by the voltage dividing resistors 600 and 650. Moreover, the speed-up capacitor 630 detects a sharp rise in a DC voltage after smoothing through the double wave rectifying bridge 440. A predetermined voltage obtained by dividing the voltage Vcc through the voltage dividing resistors 800 and 850 is applied to the positive input terminals of the comparators 830 and 840. When the negative terminal exceeds a positive terminal voltage, the comparators 830 and 840 change an output open state into a 0V output. The 0V output of the comparator 840 is transmitted as a stop signal to the switching unit oscillation control circuit 790 so that the switching unit oscillation control circuit 790 which is being operated stops the operation immediately. The 0V output of the comparator 830 extracts the electric charges of the capacitor 690 through the predetermined limiting resistor 710, thereby dropping a voltage.

Figure 24:
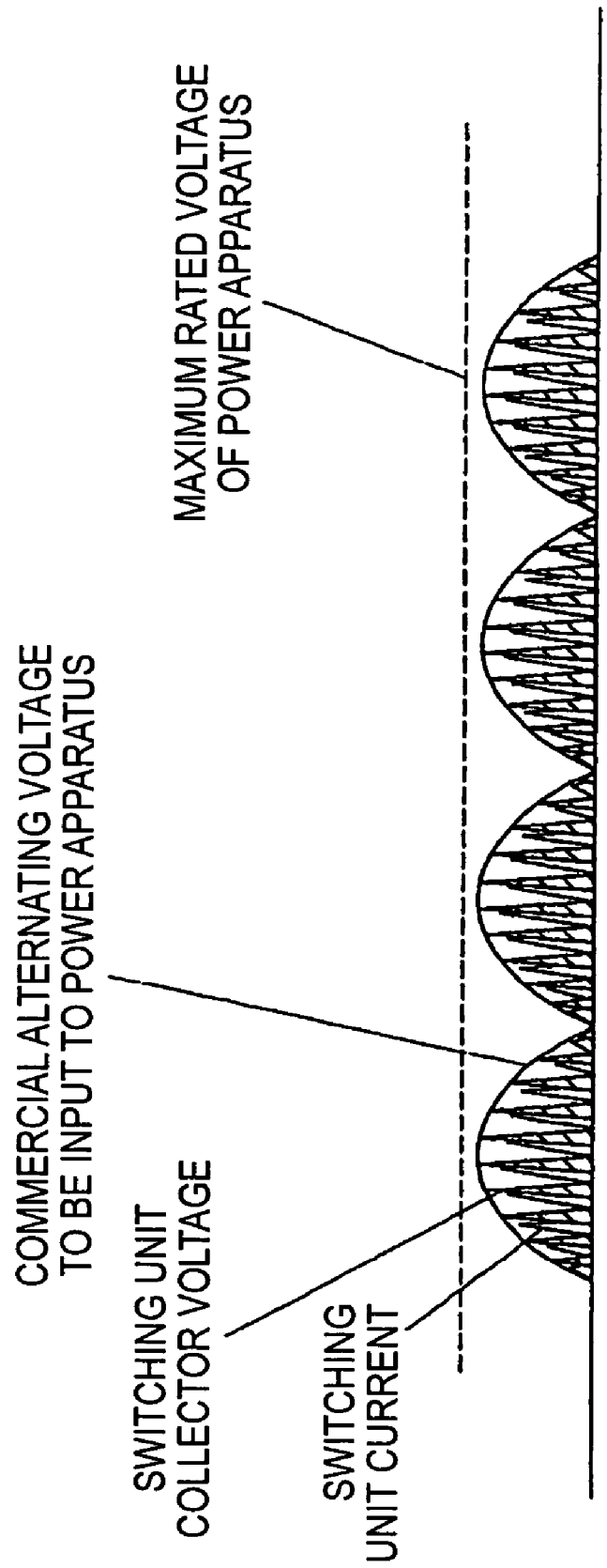
FIG. 24 is an explanatory diagram showing the operation of the power apparatus according to the embodiment of the invention.

FIG. 24 shows an operation waveform of the circuit which is thus being operated. When the commercial alternating voltage to be input to the power apparatus is higher than the maximum rated input voltage of the power apparatus or when the commercial alternating voltage to be input to the power apparatus sharply rises and fluctuates, a switching unit oscillating operation is immediately stopped by the operation and a voltage and a current to be supplied to the switching unit 520 disappear immediately as shown in the drawing. As a result, a voltage and a current are prevented from being excessively supplied to the switching unit so that the switching unit can be protected from a breakdown.

In FIG. 23, next, the DC voltage smoothed by the double wave rectifying bridge 440 is gradually dropped continuously because the consumption of the electric charges is reduced. When the DC voltage becomes lower than the maximum rated voltage of a supply voltage, the detecting operation is stopped so that the outputs of the comparators 830 and 840 are changed from 0V to an open circuit state. The open output of the comparator 840 is transmitted as the supply voltage Vcc to the switching unit oscillation control circuit 790 by the resistor 860 for determining a voltage so that the switching unit oscillation control circuit 790 which is being stopped releases the stop condition immediately and the oscillation of the switching unit is started. As described for the operation, all the electric charges are extracted so that the voltage of the capacitor 690 reaches 0V. Even if the oscillation of the switching unit is started, therefore, a voltage and a current to be supplied to the switching unit 520 are 0V and 0 A at first. Simultaneously with the start of the oscillation of the switching unit, the open output of the comparator 830 immediately stops the electric charge extracting operation of the capacitor 690 through the predetermined limiting resistor 710. As a result, the voltage of the capacitor 690 is gradually raised by the time constant circuit constituted by the resistor 700, the diode 720 and the capacitor 690, and the voltage and the current to be supplied to the switching unit which are 0V and 0 A at first as described above are gradually raised as shown in the drawing. As a result, a voltage and a current which have maximum values are suddenly supplied to the switching unit 520 so that the switching unit 520 is not damaged, and a breakdown can be prevented also in the worst case and a conducting state can be stably brought.

According to the operation, there is provided a power apparatus which does not break down also in the case in which a surge voltage of a thunder, an instantaneous service interruption caused by the voltage supply drawback of an electric power company and an instantaneous drop or rise are generated in a commercial alternating voltage to be input to the power apparatus. Consequently, a cost corresponding to a defect in a market can be reduced, thereby contributing to corporate profits.

Although the embodiments of the invention have been described above, the invention is not limited thereto and it is self-evident to those skilled in the art that various changes or modifications may be made without departing from the scope of the invention. As apparent from the description, each embodiment can be combined with the others.

The present disclosure relates to subject matter contained in priority Japanese Patent Application Nos. 2003-023780 filed on Jan. 31, 2003, 2003-023781 filed on Jan. 31, 2003, 2003-044544 filed on Feb. 21, 2003 and 2003-069989 filed on Mar. 14, 2003, the contents of which are herein expressly incorporated by reference in its entirety.

What is claimed is:

1. A heat generating apparatus for an electromagnetic induction heating fixing apparatus of an image forming apparatus, comprising:
    a heat generating member;
    an exciting coil provided opposite to the heat generating member and serving to cause the heat generating member to generate heat by electromagnetic induction;
    a thermostat provided in the vicinity of the heat generating member and serving to stop supply of power to the exciting coil when a temperature abnormality of the heat generating member is detected;
    a power circuit comprising a rectifying circuit, a resonance circuit and a smoothing circuit and serving to control the supply of the power to the exciting coil, wherein the resonance circuit is connected in parallel with the exciting coil, one end of the smoothing circuit being connected to the resonance circuit and the exciting coil, and another end of the smoothing circuit being directly connected to the rectifying circuit; and
    a lead wire connecting the exciting coil, the thermostat and the power circuit,
    wherein the thermostat is electrically connected between the rectifying circuit and the smoothing circuit, and the lead wire connects to a connector comprising two pins that connect the exciting coil to the power circuit, and two pins configured to connect the thermostat to the power circuit, wherein one of the two pins configured to connect the thermostat to the power circuit is designated for a first supply voltage, and the other pin is designated for a second supply voltage, thereby preventing an erroneous connection of the exciting coil to the power circuit.

2. The heat generating apparatus according to claim 1, wherein the exciting coil is connected to the power circuit with the lead wire and a second lead wire, and the thermostat is connected to the power circuit with the lead wire and a third lead wire.

3. A heat generating apparatus, comprising:
    a heat generating member;
    an exciting coil provided opposite to the heat generating member and serving to cause the heat generating member to generate heat by electromagnetic induction;
    a first power source for supplying power to the exciting coil;
    a power circuit comprising a rectifying circuit, a resonance circuit and a smoothing circuit, wherein the resonance circuit is connected in parallel with the exciting coil, one end of the smoothing circuit is connected to the resonance circuit and the exciting coil, and another end of the smoothing circuit is directly connected to the rectifying circuit;
    a switching unit for switching ON/OFF of the supply of the power from the first power source to the exciting coil;
    a second power source for driving the switching unit;
    a thermostat for stopping the supply of the power from the first power source to the exciting coil when the heat generating member exceeds a predetermined temperature and a lead wire connecting the exciting coil, the thermostat and the power circuit, wherein the lead wire connects to a connector comprising two pins that connect the exciting coil to the power circuit, and two pins configured to connect the thermostat to the power circuit, wherein one of the two pins configured to connect the thermostat to the power circuit is designated for a first supply voltage, and the other pin is designated for a second supply voltage, thereby preventing an erroneous connection of the exciting coil to the power circuit.

4. The heat generating apparatus as claimed in claim 3, further comprising:
    a switching unit voltage detecting circuit which detects that a voltage to be applied to the switching unit exceeds a safe operating voltage range; and
    a control circuit which controls a power to be supplied to the coil in response to a detection signal of the switching unit voltage detecting circuit.

5. The heat generating apparatus according to claim 4, wherein when the switching unit voltage detecting circuit detects that the safe operating voltage range of the switching unit is exceeded, the control circuit limits the supply of the power to the exciting coil to carry out a control in such a manner that the voltage to be applied to the switching unit is maintained within the safe operating voltage range.

6. The heat generating apparatus according to claim 4, wherein when the switching unit voltage detecting circuit detects that the safe operating voltage range of the switching unit is exceeded, the control circuit detects the supply of the power to the exciting coil and attenuates the voltage to be applied to the switching unit to a level within a safe operating voltage range.

7. The heat generating apparatus according to claim 4, wherein when the switching unit voltage detecting circuit detects that the safe operating voltage range of the switching unit is exceeded, the control circuit stops the supply of the power to the exciting coil.

8. An electromagnetic induction heating fixing apparatus for an image forming apparatus, comprising:
a heat generating member;
an exciting coil provided opposite to the heat generating member and serving to cause the heat generating member to generate heat by electromagnetic induction;
a thermostat provided in the vicinity of the heat generating member and serving to stop supply of power to the exciting coil when a temperature abnormality of the heat generating member is detected;
a power circuit comprising a rectifying circuit, a resonance circuit and a smoothing circuit and serving to control the supply of the power to the exciting coil, wherein the resonance circuit is connected in parallel with the exciting coil, one end of the smoothing circuit being connected to the resonance circuit and the exciting coil, and another end of the smoothing circuit being directly connected to the rectifying circuit; and
a lead wire connecting the exciting coil, the thermostat and the power circuit,
wherein the thermostat is electrically connected between the rectifying circuit and the smoothing circuit, and the lead wire connects to a connector comprising two pins that connect the exciting coil to the power circuit, and two pins configured to connect the thermostat to the power circuit, wherein one of the two pins configured to connect the thermostat to the power circuit is designated for a first supply voltage, and the other pin is designated for a second supply voltage, thereby preventing an erroneous connection of the exciting coil to the power circuit.

9. An image forming apparatus, comprising:
a photosensitive member;
a charger which uniformly charges a surface of the photosensitive member to have a predetermined electric potential;
an exposing unit which irradiates a scanning line of a light beam corresponding to image data on the charged photosensitive member, thereby forming electrostatic latent images;
a developer which develops the electrostatic latent images formed on the photosensitive member;
a cleaner which removes a toner remaining on the photosensitive member; and
an electromagnetic induction heating fixing apparatus, comprising:
a heat generating member;
an exciting coil provided opposite to the heat generating member and serving to cause the heat generating member to generate heat by electromagnetic induction;
a thermostat provided in the vicinity of the heat generating member and serving to stop supply of power to the exciting coil when a temperature abnormality of the heat generating member is detected;
a power circuit comprising a rectifying circuit, a resonance circuit and a smoothing circuit and serving to control the supply of the power to the exciting coil, wherein the resonance circuit is connected in parallel with the exciting coil, one end of the smoothing circuit being connected to the resonance circuit and the exciting coil, and another end of the smoothing circuit being directly connected to the rectifying circuit; and
a lead wire connecting the exciting coil, the thermostat and the power circuit,
wherein the thermostat is electrically connected between the rectifying circuit and the smoothing circuit, and the lead wire connects to a connector comprising two pins that connect the exciting coil to the power circuit, and two pins configured to connect the thermostat to the power circuit, wherein one of the two pins configured to connect the thermostat to the power circuit is designated for a first supply voltage, and the other pin is designated for a second supply voltage, thereby preventing an erroneous connection of the exciting coil to the power circuit.

* * * * *